US011597839B2

(12) United States Patent
Holt

(10) Patent No.: US 11,597,839 B2
(45) Date of Patent: Mar. 7, 2023

(54) METHODS FOR MAKING AN OBJECT AND FORMULATIONS FOR USE IN SAID METHODS

(71) Applicant: PHOTOCENTRIC LIMITED, Peterborough (GB)

(72) Inventor: Paul Holt, Peterborough (GB)

(73) Assignee: PHOTOCENTRIC LIMITED, Peterborough (GB)

( * ) Notice: Subject to any disclaimer, the term of this patent is extended or adjusted under 35 U.S.C. 154(b) by 764 days.

(21) Appl. No.: 15/761,919

(22) PCT Filed: Sep. 23, 2016

(86) PCT No.: PCT/GB2016/052960
§ 371 (c)(1),
(2) Date: Jul. 30, 2018

(87) PCT Pub. No.: WO2017/051182
PCT Pub. Date: Mar. 30, 2017

(65) Prior Publication Data
US 2018/0282544 A1    Oct. 4, 2018

(30) Foreign Application Priority Data

Sep. 25, 2015 (GB) .................................... 1517025
Jun. 15, 2016 (GB) .................................... 1610454

(51) Int. Cl.
*B29C 64/00* (2017.01)
*C08L 75/14* (2006.01)
(Continued)

(52) U.S. Cl.
CPC ............. *C08L 75/14* (2013.01); *B29C 64/00* (2017.08); *B29C 64/10* (2017.08); *B29C 64/129* (2017.08);
(Continued)

(58) Field of Classification Search
CPC ................................ C08L 75/14; B33Y 10/00
See application file for complete search history.

(56) References Cited

U.S. PATENT DOCUMENTS 6,096,794 A    8/2000  Cunningham et al.
6,140,384 A   10/2000  Sorori et al.
(Continued)

FOREIGN PATENT DOCUMENTS

CN    105085833 A    11/2005
EP       2097247 B1    3/2016
(Continued)

OTHER PUBLICATIONS

Kitano, H., Ramachandran, K., Bowden, N.B. and Scranton, A.B., 2013. Unexpected visible-light-induced free radical photopolymerization at low light intensity and high viscosity using a titanocene photoinitiator. Journal of applied polymer science, 128(1), pp. 611-618. (Year: 2012).*
(Continued)

*Primary Examiner* — Nicholas R Krasnow
(74) *Attorney, Agent, or Firm* — Nexsen Pruet, PLLC; E. Eric Mills; Nicholas P. Stadnyk

(57) ABSTRACT

The present invention relates to formulations for use in 3-D printing using radiation from visual display screens. The formulations comprise titanocene photoinitiators and co-initiators. The invention also relates to methods of forming 3-D objects using said formulations.

12 Claims, 6 Drawing Sheets

(51) Int. Cl.
| | |
|---|---|
| *B33Y 70/00* | (2020.01) |
| *B33Y 10/00* | (2015.01) |
| *B29C 64/129* | (2017.01) |
| *G03F 7/027* | (2006.01) |
| *G03F 7/029* | (2006.01) |
| *G03F 7/00* | (2006.01) |
| *B33Y 80/00* | (2015.01) |
| *B29C 64/255* | (2017.01) |
| *B29C 64/20* | (2017.01) |
| *B29C 64/176* | (2017.01) |
| *B29C 64/307* | (2017.01) |
| *B33Y 50/00* | (2015.01) |
| *B29C 64/205* | (2017.01) |
| *B29C 64/30* | (2017.01) |
| *B29C 64/40* | (2017.01) |
| *B29C 64/182* | (2017.01) |
| *B33Y 40/00* | (2020.01) |
| *B33Y 40/20* | (2020.01) |
| *B29C 64/245* | (2017.01) |
| *B33Y 40/10* | (2020.01) |
| *B29C 64/227* | (2017.01) |
| *B29C 64/10* | (2017.01) |
| *B29C 64/25* | (2017.01) |
| *B33Y 99/00* | (2015.01) |
| *B29K 33/00* | (2006.01) |
| *B29C 64/264* | (2017.01) |
| *B33Y 30/00* | (2015.01) |

(52) U.S. Cl.
CPC .......... *B29C 64/176* (2017.08); *B29C 64/182* (2017.08); *B29C 64/20* (2017.08); *B29C 64/205* (2017.08); *B29C 64/227* (2017.08); *B29C 64/245* (2017.08); *B29C 64/25* (2017.08); *B29C 64/255* (2017.08); *B29C 64/30* (2017.08); *B29C 64/307* (2017.08); *B29C 64/40* (2017.08); *B33Y 10/00* (2014.12); *B33Y 40/00* (2014.12); *B33Y 40/10* (2020.01); *B33Y 40/20* (2020.01); *B33Y 50/00* (2014.12); *B33Y 70/00* (2014.12); *B33Y 80/00* (2014.12); *B33Y 99/00* (2014.12); *G03F 7/0037* (2013.01); *G03F 7/027* (2013.01); *G03F 7/029* (2013.01); *B29C 64/264* (2017.08); *B29K 2033/08* (2013.01); *B29K 2827/12* (2013.01); *B29K 2871/00* (2013.01); *B29K 2995/0026* (2013.01); *B33Y 30/00* (2014.12)

(56) References Cited

U.S. PATENT DOCUMENTS

| | | | |
|---|---|---|---|
| 6,743,514 B1* | 6/2004 | Samaranayake | B41M 5/52 524/832 |
| 2001/0019806 A1* | 9/2001 | Sato | C09B 55/00 430/138 |
| 2002/0009553 A1* | 1/2002 | Lutz | B41M 1/40 427/552 |
| 2002/0092436 A1* | 7/2002 | Tsuchiya | G03F 7/033 101/450.1 |
| 2002/0093115 A1* | 7/2002 | Jang | B33Y 10/00 264/113 |
| 2004/0135292 A1* | 7/2004 | Coats | B29C 64/40 264/401 |
| 2006/0073280 A1 | 4/2006 | Bauer et al. | |
| 2009/0190107 A1 | 7/2009 | Holt | |
| 2013/0303651 A1* | 11/2013 | Nakatani | C09D 133/14 522/96 |
| 2014/0339741 A1* | 11/2014 | Aghababaie | B33Y 30/00 264/401 |
| 2016/0200042 A1* | 7/2016 | Jeng | B33Y 50/00 264/401 |
| 2016/0264696 A1* | 9/2016 | Jeng | B29C 64/129 |
| 2017/0306221 A1* | 10/2017 | Koole | C09D 183/04 |
| 2018/0282544 A1* | 10/2018 | Holt | B29C 64/129 |
| 2018/0290374 A1* | 10/2018 | Willis | B29C 64/124 |
| 2019/0160733 A1* | 5/2019 | Mirkin | B29C 64/245 |
| 2020/0001433 A1* | 1/2020 | Bajaj | B24D 3/28 |
| 2020/0046462 A1* | 2/2020 | Chen | C08G 75/26 |
| 2021/0017412 A1* | 1/2021 | Wei | C09D 11/106 |

FOREIGN PATENT DOCUMENTS

| | | |
|---|---|---|
| GB | 2320027 A | 6/1998 |
| WO | 9852952 | 11/1998 |
| WO | 2008077850 A2 | 7/2008 |
| WO | 2014095724 A1 | 6/2014 |

OTHER PUBLICATIONS

Zonca Jr, M.R., Falk, B. and Crivello, J.V., 2004. LED-Induced Thiol-ene Photopolymerizations. Journal of Macromolecular Science, Part A, 41(7), pp. 741-756. (Year: 2004).*

Liska, R., Schuster, M., Inführ, R., Turecek, C., Fritscher, C., Seidl, B., Schmidt, V., Kuna, L., Haase, A., Varga, F. and Lichtenegger, H., 2007. Photopolymers for rapid prototyping. Journal of Coatings Technology and Research, 4(4), pp. 505-510. (Year: 2007).*

* cited by examiner

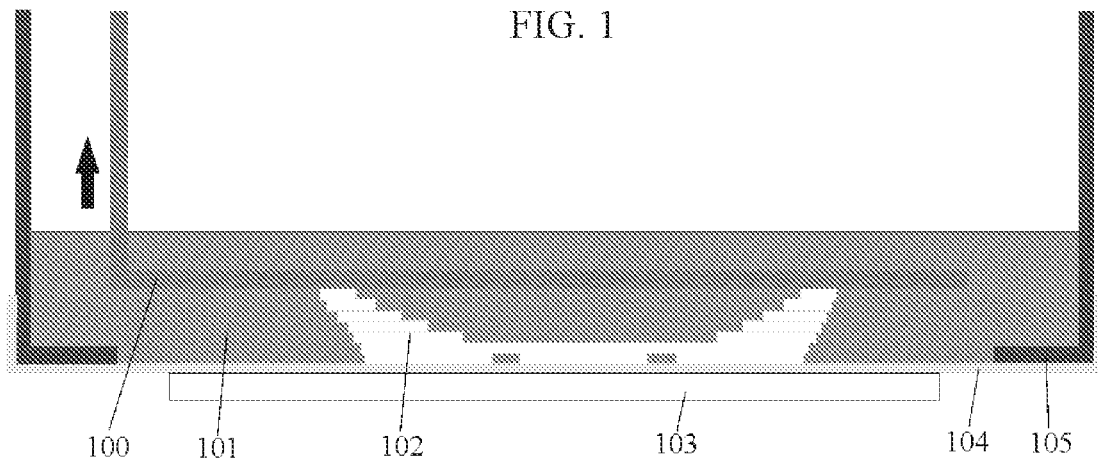
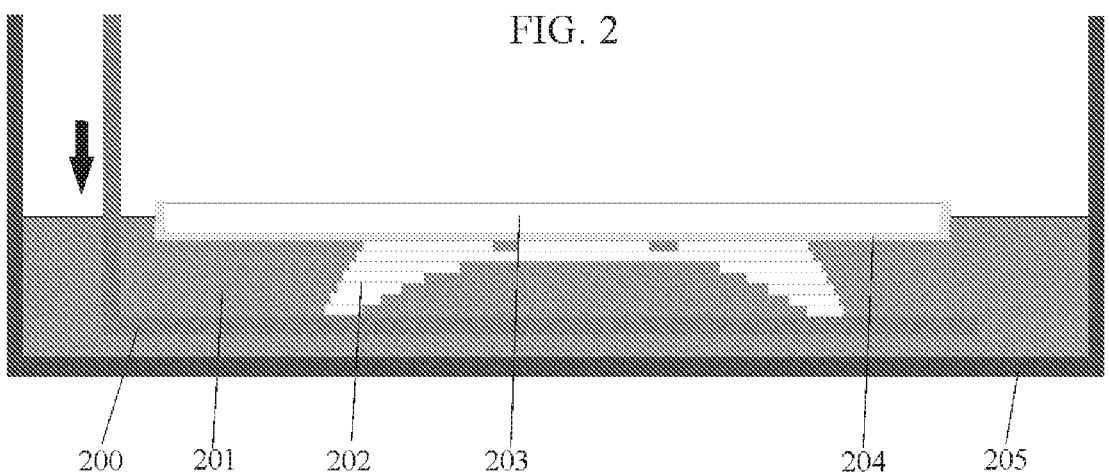

METHODS FOR MAKING AN OBJECT AND FORMULATIONS FOR USE IN SAID METHODS

FIELD OF THE INVENTION

This invention relates to polymer resin formulations for use in making 3D images. The formulations comprise titanocene photoinitators and co-initiators. This invention also relates to a method for making a three dimensional (3D) image by additive manufacturing or 3D printing. Specifically it describes formulations and techniques that optimise the speed of printing, resolution of image and properties of the finished objects in 3D printed objects created by daylight emitting liquid crystal display (LCD) screens.

BACKGROUND OF THE INVENTION

This invention lies in the field of 3D printing, also known as rapid prototyping or additive manufacturing. It is a method of creating three dimensional objects in layers each obtained from a digital representation of the object. Typically an object is scanned in 3 dimensions or generated digitally by computer-aided design (CAD) and split into layers of a pre-determined thickness. These layers are sequentially sent to a 3D printer which builds each layer of the image, then moves the build platform away from the imaging source by the thickness of one layer. The printer then starts the process of creating the next layer on top of the layer just laid down. There are a number of different types of 3D printing and thus different methods of creating these layers.

This invention is a form of stereolithography. Here 3D objects are created in photopolymer (light sensitive resin) by selectively applying electromagnetic radiation to areas of the liquid. This invention specifically relates to the field of 3D printing where the image source is an LCD screen which emits solely daylight. The screen is not modified to adjust its backlight to generate shorter wavelengths of light below 400 nm as is the case in all other 3D printers that use LCD screens as the light control device.

UK patent applications GB 1508178.9, GB 1513771.4 and international application PCT/GB2016/051361 (unpublished at the time of filing), herein incorporated by reference in their entirety, describe the use of daylight active photoinitators incorporated into photopolymer that is active enough to polymerise by light emitted from commercially available LCD screens to create 3D objects. GB 1513771.4 also describes how to create 3D images from LCD screens including tablets, mobile phones and display screens. The novel 3D systems using daylight hardening resins mentioned in these patent applications provide benefits relative to previous 3D-printing techniques in terms of significantly lower capital cost and lower energy usage, as well as surprisingly high resolutions. The techniques described in those applications was, however, slower than previous 3D-printing techniques and the final object properties could be limited in resolution and surface dryness.

SUMMARY OF THE INVENTION

In a first aspect of the invention is provided a liquid photopolymer formulation for forming a 3-dimensional object when exposed to visible light, the formulation comprising:
at least one monomeric or oligomeric chemical species comprising at least one carbon-carbon double bond that is polymerisable by free radical polymerisation, said monomeric or oligomeric chemical species being present in a total amount of from 25 to 99 wt %;
at least one titanocene photoinitiator present in a total amount of from 0.1 to 15 wt %;
at least one coinitiator present in a total amount of from 0.5 to 20 wt %; and optionally at least one pigment or dye.

It may be that the total amount of titanocene present is from 0.5 to 5%. It may be that the total amount of titanocene present is from 0.9 to 2.5 wt %. The titanocene may be selected from: bis($\eta^5$-2,4-cyclopentadien-1-yl)bis[2,6-difluoro-3-(1H-pyrrol-1-yl)phenyl]titanium, titanocene bis(trifluoromethanesulfonate), titanocene dichloride, (indenyl)titanium (IV) trichloride, (pentamethylcyclopentadienyl) titanium (IV) trichloride, cyclopentadienyltitanium (IV) trichloride, bis(cyclopentadienyl)titanium (IV) pentasulfide, (4R,5R)-chloro-cyclopentadienyl-[2,2-dimethyl-1,3-dioxolan-4,5-bis(diphenylmethoxy)]titanium, (4S,5S)-chloro-cyclopentadienyl-[2,2-dimethyl-1,3-dioxolan-4,5-bis(diphenylmethoxy)]titanium and a mixture thereof. It may be that the formulation comprises a single titanocene. The single titanocene may be selected from: bis($\eta^5$-2,4-cyclopentadien-1-yl)bis[2,6-difluoro-3-(1H-pyrrol-1-yl)phenyl]titanium, titanocene bis(trifluoromethanesulfonate), titanocene dichloride, (indenyl)titanium (IV) trichloride, (pentamethylcyclopentadienyl)titanium (IV) trichloride, cyclopentadienyltitanium (IV) trichloride, bis(cyclopentadienyl)titanium (IV) pentasulfide, (4R,5R)-chloro-cyclopentadienyl-[2,2-dimethyl-1,3-dioxolan-4,5-bis(diphenylmethoxy)]titanium and (4S,5S)-chloro-cyclopentadienyl-[2,2-dimethyl-1,3-dioxolan-4,5-bis(diphenylmethoxy)]titanium. Preferably, the titanocene is bis($\eta^5$-2,4-cyclopentadien-1-yl)-bis(2,6-difluoro-3-(1H-pyrrol-1-yl)-phenyl) titanium.

It may be that the total amount of coinitiator present is from 1 to 10 wt %. It may be that the total amount of coinitiator present is from 1.5 to 5 wt %. It may be that the total amount of coinitiator present is from 1.5 to 5 wt % and the total amount of titanocene present is from 0.9 to 2.5 wt %. It may be that the total amount of coinitiator present is from 2 to 4 wt %.

Preferably, the coinitiator comprises thiol groups. Thus, the coinitiator may be a compound defined by the formula X—(SH)$_n$ where X represents any organic moiety, and n represents a number from 1 to 10. Such compounds are hereafter referred to as 'thiols'. Thus, the coinitiator may be selected from 2-mercaptobenzoxazole, 2-mercaptobenzothiazole, 2-mercaptobenzimidazole, pentaerythritol-tetrakis (mercaptoacetate), 4-acetamidothiophenol, mercaptosuccinic acid, dodecanthiol, betamercaptoethanol, 6-ethoxy-2-mercaptobenzothiazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4-methoxybenzene thiol, 1-phenyl-1H-tetrazole-5-thiol, 4-phenyl-4H-1,2,4-triazole-3-thiol, pentaerythritol-tetrakis (3-mercaptopropionate), trimethylolpropane-tris(mercaptoacetate), 2-mercaptopyridine, 4-mercaptopyridine, 2-mercapto-3H-quinazoline and 2-mercaptothiazoline or a mixture thereof. The coinitiator may be pentaerythritol tetrakis(3-mercaptopropionate). The coinitiator may be an oligomeric moiety comprising thiol groups, e.g. a mercapto-modified polyester acrylate.

An 'organic moiety' is intended to mean any hydrocarbyl group or group of hydrocarbyl groups, for example one or more hydrocarbyl group selected from an alkyl group, cycloalkyl group, aromatic group, heteroaromatic group, heterocyclic group, alkenyl group, any of said groups being substituted by or linked together by an aldehyde, halogen, ketone, carboxyllic acid or ester, ether, thioether, amine, amide functionality.

A thiol group is a —S—H group, the —S—H group being typically attached to a carbon atom in an organic moiety. Such groups are sometimes referred to as mercaptans. A thiol coinitiator is a coinitiator that comprises a thiol group.

It may be that the at least one monomeric or oligomeric chemical species comprising at least one carbon-carbon double bond that is polymerisable by free radical polymerisation is present in a total amount of from 50 to 98 wt %. It may be that the at least one monomeric or oligomeric chemical species comprising at least one carbon-carbon double bond that is polymerisable by free radical polymerisation is present in a total amount of from 80 to 96 wt %. It may be that the at least one monomeric or oligomeric chemical species comprising at least one carbon-carbon double bond that is polymerisable by free radical polymerisation is present in a total amount of from 90 to 95 wt %.

It may be that the formulation comprises at least one monomeric species comprising at least one carbon-carbon double bond that is polymerisable by free radical polymerisation and at least one oligomeric species comprising at least one carbon-carbon double bond that is polymerisable by free radical polymerisation.

It may be that the total amount of the oligomeric species comprising at least one carbon-carbon double bond that is polymerisable by free radical polymerisation in the formulation is from 30 to 85 wt %. It may be that the total amount of the oligomeric species comprising at least one carbon-carbon double bond that is polymerisable by free radical polymerisation in the formulation is from 30 to 80 wt %. It may be that the total amount of the oligomeric species comprising at least one carbon-carbon double bond that is polymerisable by free radical polymerisation in the formulation is from 30 to 40 wt %. It may be that the total amount of the oligomeric species comprising at least one carbon-carbon double bond that is polymerisable by free radical polymerisation in the formulation is from 40 to 60 wt %. It may be that the total amount of the oligomeric species comprising at least one carbon-carbon double bond that is polymerisable by free radical polymerisation in the formulation is from 50 to 75 wt %.

It may be that the total amount of the monomeric species comprising at least one carbon-carbon double bond that is polymerisable by free radical polymerisation in the formulation is from 15 to 80 wt %. It may be that the total amount of the monomeric species comprising at least one carbon-carbon double bond that is polymerisable by free radical polymerisation in the formulation is from 30 to 80 wt %. It may be that the total amount of the monomeric species comprising at least one carbon-carbon double bond that is polymerisable by free radical polymerisation in the formulation is from 35 to 50 wt %. It may be that the total amount of the monomeric species comprising at least one carbon-carbon double bond that is polymerisable by free radical polymerisation in the formulation is from 50 to 70 wt %. It may be that the total amount of the monomeric species comprising at least one carbon-carbon double bond that is polymerisable by free radical polymerisation in the formulation is from 20 to 45 wt %.

It may be that the total amount of the oligomeric species comprising at least one carbon-carbon double bond that is polymerisable by free radical polymerisation in the formulation is from 30 to 40 wt % and the total amount of the monomeric species comprising at least one carbon-carbon double bond that is polymerisable by free radical polymerisation in the formulation is from 50 to 70 wt %. It may be that the total amount of the oligomeric species comprising at least one carbon-carbon double bond that is polymerisable by free radical polymerisation in the formulation is from 40 to 60 wt % and the total amount of the monomeric species comprising at least one carbon-carbon double bond that is polymerisable by free radical polymerisation in the formulation is from 35 to 50 wt %. It may be that the total amount of the oligomeric species comprising at least one carbon-carbon double bond that is polymerisable by free radical polymerisation in the formulation is from 40 to 75 wt % and the total amount of the monomeric species comprising at least one carbon-carbon double bond that is polymerisable by free radical polymerisation in the formulation is from 20 to 30 wt %. In these embodiments, it may be that the total amount of coinitiator present is from 1.5 to 5 wt % and the total amount of titanocene present is from 0.9 to 2.5 wt %.

It may be that the formulation comprises an aliphatic urethane monomer comprising a single carbon-carbon double bond that is polymerisable by free radical polymerisation. Said aliphatic urethane monomer may be present in an amount from 15 to 30 wt % of the formulation. Said aliphatic urethane monomer may comprise an acrylate group. Said aliphatic urethane monomer may be N-butyl-O-2-acryloxyethylcarbamate:

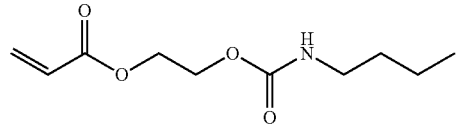

Other exemplary monomers include lauryl acrylate, triethyleneglycoldimethacrylate (TEGDMA), trimethylolpropanetrimethacrylate (TMPTMA), trimethylolpropanetriacrylate (TMPTA) and tricyclodecanedimethanoldiacrylate (TCDDA). Typically a mixture of any two or more monomers are used, with the choice of monomers and the relative proportions depending on the desired properties of the resultant cured polymer.

It may be that the oligomeric species is an aliphatic urethane acrylate oligomer. Said oligomers may comprise a single acrylate group, two acrylate groups or three acrylate groups depending on the desired properties of the resultant cured polymer. Where the oligomeric species are aliphatic urethane oligomers, the formulation preferably also comprises an aliphatic urethane monomer comprising a single carbon-carbon double bond that is polymerisable by free radical polymerisation, e.g. N-butyl-O-2-acryloxyethylcarbamate.

Certain formulations of the invention comprise:
  30 to 40 wt % aliphatic urethane acrylate oligomer comprising a single acrylate group;
  15 to 30 wt % an aliphatic urethane monomer comprising a single acrylate group; 35 to 50 wt % other monomeric species comprising at least one carbon-carbon double bond that is polymerisable by free radical polymerisation (e.g. a mixture of lauryl acrylate, TMPTA and TCDDA);
  1.5 to 5 wt % at least one thiol coinitiator (e.g. mercaptomodified polyester acrylate); and
  0.9 to 2.5 wt % at least one titanocene (e.g. bis($\eta^5$-2,4-cyclopentadien-1-yl)-bis(2,6-difluoro-3-(1H-pyrrol-1-yl)-phenyl) titanium). This formulation may be particularly useful in forming flexible polymers once cured.

Certain formulations of the invention comprise:
- 40 to 60 wt % aliphatic urethane acrylate oligomer comprising two acrylate groups;
- 15 to 30 wt % an aliphatic urethane monomer comprising a single acrylate group;
- 15 to 30 wt % other monomeric species comprising at least one carbon-carbon double bond that is polymerisable by free radical polymerisation (e.g. a mixture of TEGDMA and TMPTMA);
- 1.5 to 5 wt % at least one thiol coinitiator (e.g. mercaptomodified polyester acrylate); and
- 0.9 to 2.5 wt % at least one titanocene (e.g. bis($\eta^5$-2,4-cyclopentadien-1-yl)-bis(2,6-difluoro-3-(1H-pyrrol-1-yl)-phenyl) titanium). This formulation may be particularly useful in forming firm polymers once cured.

Certain formulations of the invention comprise:
- 40 to 60 wt % aliphatic urethane acrylate oligomer comprising three acrylate groups;
- 15 to 30 wt % an aliphatic urethane monomer comprising a single acrylate group;
- 15 to 30 wt % other monomeric species comprising at least one carbon-carbon double bond that is polymerisable by free radical polymerisation (e.g. a mixture of TEGDMA and TMPTA);
- 1.5 to 5 wt % at least one thiol coinitiator (e.g. mercaptomodified polyester acrylate); and
- 0.9 to 2.5 wt % at least one titanocene (e.g. bis($\eta^5$-2,4-cyclopentadien-1-yl)-bis(2,6-difluoro-3-(1H-pyrrol-1-yl)-phenyl) titanium). This formulation may be particularly useful in forming hard polymers once cured.

It may be that the oligomeric species is an epoxy acrylate oligomer. Said oligomer may comprise a single acrylate group, two acrylate groups or three acrylate groups depending on the desired properties of the resultant cured polymer. The epoxy acrylate oligomers may be used in combination with an aliphatic urethane monomer comprising a single acrylate group as described above in combination with aliphatic polyurethane oligomers. Epoxy acrylate based resins can provide less shrinkage when polymerised in the methods described in this specification than equivalent polyurethane resins.

Certain formulations of the invention comprise:
- 40 to 75 wt % epoxy acrylate oligomer comprising at least one acrylate group;
- 20 to 55 wt % monomeric species comprising at least one carbon-carbon double bond that is polymerisable by free radical polymerisation;
- 1.5 to 5 wt % at least one thiol coinitiator (e.g. mercaptomodified polyester acrylate); and
- 0.9 to 2.5 wt % at least one titanocene (e.g. bis($\eta^5$-2,4-cyclopentadien-1-yl)-bis(2,6-difluoro-3-(1H-pyrrol-1-yl)-phenyl) titanium).

Certain formulations of the invention comprise:
- 40 to 75 wt % epoxy acrylate oligomer comprising at least one acrylate group;
- 10 to 30 wt % an aliphatic urethane monomer comprising a single acrylate group;
- 10 to 30 wt % other monomeric species comprising at least one carbon-carbon double bond that is polymerisable by free radical polymerisation;
- 1.5 to 5 wt % at least one thiol coinitiator (e.g. mercaptomodified polyester acrylate); and
- 0.9 to 2.5 wt % at least one titanocene (e.g. bis($\eta^5$-2,4-cyclopentadien-1-yl)-bis(2,6-difluoro-3-(1H-pyrrol-1-yl)-phenyl) titanium).

The formulation may comprise at least one pigment or dye. The formulation may comprise at least one stabiliser that prevents degradation of the cured polymer in the 3D object and/or at least one stabiliser that prevents overcure.

The formulation is preferably suitable for use in forming a 3-dimensional object when exposed to visible light from a visual display screen that is suitable for human viewing. Thus, the formulation is preferably suitable for use in forming a 3-dimensional object when exposed to visible light from a visual display screen that does not emit UV light. The visible display screen may be a visible display screen as described in relation to the second and third aspects of the invention. Thus, the formulation may be suitable for use in the methods of the first and second aspects of the invention.

In a second aspect of the invention is provided a method for creating a 3-dimensional object, the method comprising forming more than two layers of a cured polymer by exposing a liquid photopolymer formulation to light emitted by a visual display screen suitable for human viewing. It may be that the visual display screen is adapted for human viewing. The photopolymer formulation may be a formulation of the first aspect.

In a third aspect of the invention is provided a method for creating a 3-dimensional object, the method comprising forming more than two layers of a cured polymer by exposing a liquid photopolymer formulation to light emitted by a visual display screen, wherein none of the light emitted by the screen is UV light. The photopolymer formulation may be a formulation of the first aspect.

The screen may be a screen of which less than 5% (e.g. less than 0.5%) of the light emitted by the screen is UV light, e.g. it may be that none of the light emitted is UV light. The screen may be an 'off-the-shelf screen', e.g. a computer screen, monitor, laptop, tablet or mobile phone.

The screens used in the methods of the invention may be suitable for human viewing. The screens used in the methods of the invention may emit little or no UV radiation. Using 'off'-the-shelf display screens means that the cost of producing a 3D printer which carries out the method of the invention is lower than it would be if the backlighting of the screen had been replaced with a more intense light. Typically, bulbs which offer an increased intensity of light also emit significant amounts of UV light. A 3D printer which carries out the method of the invention might be expected to have a greater longevity than one using a screen with a backlight which has been modified to provide a more intense light source. Screens that emit little or no UV light are inherently safer to the human eye than those that emit a high level of UV light.

The visual display screen is selected from a light emitting diode type (LED), an organic light emitting diode type (OLED), a polymer light emitting diode type (PLED), an electroluminescent display type (ELD) and a plasma display panel type (PDP). Most preferably, the visual display screen is a liquid crystal display screen (LCD).

Visual display screens used for human viewing emit orders of magnitude less light than the light sources used in existing 3D printers. A normal LCD screen emits of the order of 300 cd/m$^2$, whereas the typical DLP projector in a 3D printer emits orders of magnitude greater, at around 3000 lumens.

It may be that the visual display screen is suitable for human viewing. It may be that the visual display screen is adapted for human viewing. It may be that there is a single screen. The visual display screen may be an 'off'-the-shelf screen. The visual display screen may be a television monitor, a computer such as a laptop, a mobile device such as a smart phone or a tablet computer such as an ipad. The screen may be unmodified after manufacture.

LCD screens manufactured for human viewing are typically illuminated by LED backlights. As LEDs used to backlight LCD screens emit a single frequency they have no emissions in the UV region. It may be that less than 5% of the light emitted by the screen is UV light. It may be that less than 2% of the light emitted by the screen is UV light. More preferably it may be that less than 1% (e.g. less than 0.5%) of the light emitted by the screen is UV light. Even more preferably, it may be that less than 0.1% (e.g. less than 0.05%) of the light emitted by the screen is UV light. It may be that no UV light can be detected in the light emitted by the screen. Visual display screens adapted for human viewing typically emit no light in the UV region. Anything other than negligible amounts of UV radiation is harmful to the human eye. The distribution of wavelengths emitted by a screen will typically be available as a graph as part of the manufacturer's technical data package. Integration of the relevant portions of that graph can be used to determine the proportion of the light emitted which is UV light. The distribution of radiation, and therefore the relative proportions of the components of that radiation, may also be determined using a light meter configured to measure the amount of light emitted across the appropriate ranges of wavelengths.

It may be that the visual display screen has a luminance of between 100 and 2000 candela per square metre (cd/sqm). Thus, it may be that the visual display screen has a luminance of between 200 to 400 cd/sqm. The visual display screen may have a luminance of greater than 175 cd/sqm. The visual display screen may have a luminance of greater than 500 cd/sqm. The luminance is intended to mean the total luminance, i.e. the sum of the individual luminances for UV radiation, visible light, IR radiation, etc. The luminance of a screen will typically be provided as part of the manufacturer's technical data. It may also be determined using a light meter configured to measure the amount of light emitted across the range of wavelengths emitted by the screen. Thus, the luminance of a screen can be measured using a luminance meter such as the LS-100 made by Konica. This instrument can provide accurate measurements of the cd/sqm and produce and accurate relative photopic luminosity curve. The test procedure is to turn the screen on for 5 minutes to allow it to reach maximum emission and then in a dark enclosure place the LS-100 on the screen and take the reading in cd/sqm.

It may be that the visual display screen has 100 pixels per inch or greater, e.g. 125 pixels per inch or greater. It may be that the visual display screen has 175 pixels per inch or greater. It may be that the visual display screen has a ratio of its contrast ratio to its luminescence that is above 1.0.

The photopolymer may be in direct contact with the visual display screen. The photopolymer may be separated from the visual display screen by a liquid layer. The photopolymer may be separated from the visual display screen by a gaseous layer. The photopolymer may be separated from the visual display screen by a filmic layer.

It may be that at least three adjacent layers of the cured polymer are not superimposed throughout the whole extent of each. The three adjacent layers therefore may form different images.

It may be that the photopolymer is in direct contact with the visual display screen. It may be that the visual display screen is coated with a low surface energy coating, e.g. a silicone coating. Similarly, the visual display screen may be separated from the photopolymer by a film of transparent plastic. The transparent plastic may be a perfluoroalkoxy copolymer or a fluorinated ethylene propylene. The transparent plastic may be PFA. The transparent plastic may have a siliconized surface.

It may be that the photopolymer is separated from the visual display screen by a liquid layer. It may be that the photopolymer is separated from the visual display screen by a gaseous layer.

It may be that the visual display screen is comprised in a handheld device and the liquid photopolymer is contained in a tray having a transparent base, the tray being situated above the screen. The visual display screen may be the screen of a device selected from laptop computer, tablet computer or mobile phone. The base of the tray may be made from a material selected from: polypropylene, polystyrene, polyester, polyethylene and polycarbonate. The internal face of the base of the tray may be coated with a silicone compound. The base of the tray may be made from a material selected from: silicone elastomer, fluorinated ethylene propylene, perfluoroalkoxy copolymer and polytetrafluoroethylene.

The term 'transparent' is not intended to mean colourless, the film may be tinted. The term transparent is therefore intended to mean that the film allows light of the wavelength emitted by the screen to pass.

BRIEF DESCRIPTION OF THE DRAWINGS

Embodiments of the invention are further described hereinafter with reference to the accompanying drawings, in which:

FIG. 1 shows an exemplary apparatus suitable for carrying out the methods of the invention, this is the method described in the standard procedure.

FIG. 2 shows an alternative exemplary apparatus suitable for carrying out the methods of the invention.

DETAILED DESCRIPTION

Figure 3:
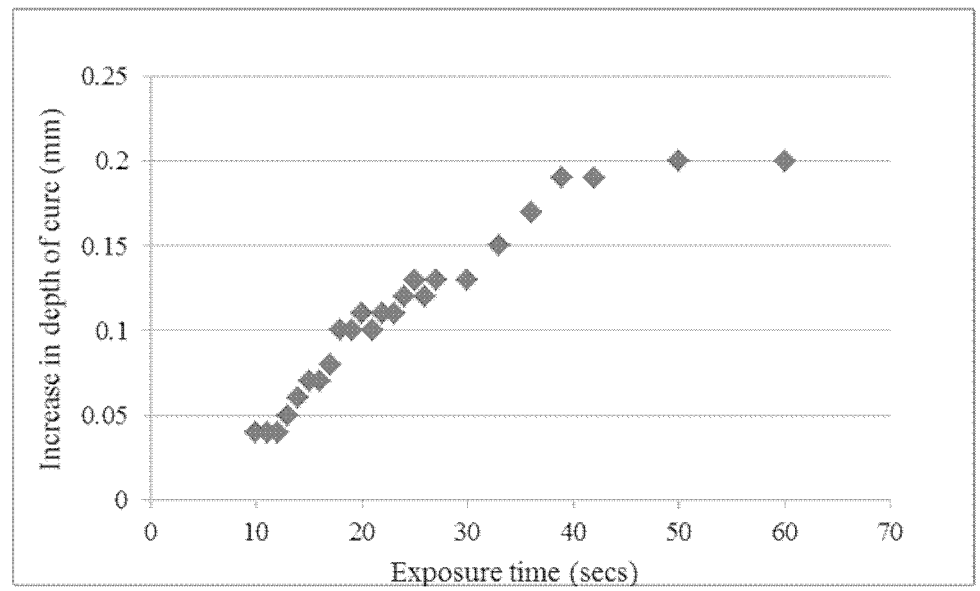
FIG. 3 shows graphically the data in Table 2, the growth of polymer at increasing exposure times when using the standard formula with the addition of 2% of Irg.784.

This invention utilises novel photopolymer formulations which are highly active in the visible light region. This enables the use of unmodified LCD screens manufactured for human viewing with light generated by light emitting diode (LED) backlights that are emitting solely daylight. As LEDs emit a single frequency they have no emissions in the ultra violet (UV) region.

An LCD typically consists of an array of pixels. Each pixel consists of a layer of liquid crystal molecules aligned between two transparent electrodes and two polarizing filters (parallel and perpendicular), the axes of transmission of which are, in most of the cases, perpendicular to each other. Before an electric field is applied, the orientation of the liquid-crystal molecules is commonly twisted, the surface alignment directions at the two electrodes are perpendicular to each other and so the molecules arrange themselves in a helical structure. By controlling the voltage applied across the liquid crystal layer in each pixel, light can be allowed to pass through in varying amounts thus creating different levels of grey.

The apparatus of the 3D printer, other than its light emitting screen, used in this invention may in principle be the same as any machine commonly used in stereolithographic printers. The process of creating the layers may in principle be the same as in existing stereolithography (SLA) systems, but has been modified for the invention. The resin has been modified to make it reactive to the light emitted from the LCD screens.

The length of time that the screen illuminates the image is determined by the rate of curing of the polymer and the intensity of light being emitted from the screen thus curing it. It is desirable that the required cure time is as short as time as possible, typically a number of seconds from 1 to 60 seconds, more typically from 3 to 30 seconds. It is highly desirable that this exposure time is a short as possible as one of the accepted drawbacks of 3D printing is the long time it takes to create objects.

In conventional SLA machines the build platform moves away from the imaging source to allow liquid polymer to refresh the imaging area and then returns to a separation of the layer thickness away, these times are a function of the viscosity of the liquid and how quickly it can re-cover the platform and are hard to reduce significantly. So in practice the exposure time, or the time the imaging source is hardening the polymer, is the time that machine manufacturers try to reduce to build objects faster.

There are other methods used to enable easy screen detachment and to allow resin to flow back. It is possible to move the print platform away from the screen at an angle so the peel area is a line rather than the entire build area. It is possible that the build platform itself bends or is hinged so the detachment force is applied at an angle to the screen. It is possible to use a flexible inner lamina of transparent film that can be peeled back from the screen surface. It is also possible to inject resin to separate the platform from the screen with jets of liquid resin. The method of screen detachment is not critical to this invention and is not limited to these examples.

Typically the photosensitive resin is filled into a vat or tray. The object will be created on a build platform which is immersed in the tray. The build platform can be moved in the vertical plane inside that tray of polymer. The build platform is desirably made from a light strong and non-flexible material, suitably aluminium, stainless steel or rigid plastic. The surface of the build platform should be a material that the polymer will grow onto easily. It has been found that the best results were obtained by using anodised aluminium with a surface that was slightly roughened or plastics with a high surface energy, these plastics can be coated with acrylic compounds or even coated with photoinitiators that are active in the same region as the photoinitiators in the polymer.

SLA 3D printers typically require relatively low viscosity polymers to enable the new layer of liquid polymer coating the object to be applied evenly and quickly. This viscosity may be less than 5,000 cps at 25° C. and desirably less than 500 cps at 25° C. In practice as low a viscosity as possible is advantageous for ease of re-covering the build platform.

Any suitable polymerisable compound or compounds can be used to form the base of the photopolymer formulations of this invention. The photopolymer is typically a urethane acrylate or an epoxy acrylate, but could be any compound that is polymerisable in the presence of an activated photoinitiator. The photopolymer may be created by combining urethane acrylate oligomers with reactive monomers and photoinitiators. The photoinitiators have to have the ability to absorb in the visible region of the electromagnetic spectrum and pass that energy on, typically as free radicals. The concentration of the photoinitiators must be optimised to create the maximum level of photosensitivity. This level is obtained by practical experimentation and can for example be from 0.1% to 10% by weight and more typically at levels of from 0.5 to 3%, the percentages being calculated by weight of the total liquid photopolymer. It is desirable that the cure speed of the reaction is adjusted so that the rate of growth is as fast as practical. The rate of cure will determine the programmed time to expose light from the screen to harden a layer of the desired thickness in the apparatus.

The visual display screen may be a liquid crystal display screen (LCD), e.g. a single LCD screen. The visual display screen may be selected from a light emitting diode type (LED), an organic light emitting diode type (OLED), a polymer light emitting diode type (PLED), an electroluminescent display type (ELD) and a plasma display panel type (PDP). The visual display screen may be a LCD screen (e.g. a single LCD screen) that is backlit by LEDs.

The photopolymer may be in direct contact with the visual display screen. The photopolymer may be separated from the screen by a liquid layer. The photopolymer may be separated from the screen by a gaseous layer. The photopolymer may be separated from the screen by a solid layer.

The solid layer may for example be a coating such as polydimethylsiloxane (PDMS) applied to the base of the tray or the screen. The PDMS coating creates a thin lubricating film of un-polymerized resin through its action as a polymerization inhibitor. It is possible that this is caused by ability for silicones to retain oxygen in their surface, which is a known inhibitor of photoinitiation. Alternatively, another polymerisation inhibitor, stabiliser or a combination of them may be applied to the base of the container.

The photopolymer may be separated from the visual display screen by a filmic layer. The film may be a low surface energy film tightened over a frame or open-bottomed tray. These films can be for example any light-transmitting plastic such as polypropylene, polyester, polycarbonate, polyethylene or a plastic with silicone particles that are grafted or nano-coated onto their surface to reduce the surface energy. It is also possible to use transparent polytetrafluoroethylene (PTFE) or perfluoroalkoxy copolymer (PFA) film. The filmic layer is most desirably a fluorinated ethylene propylene (FEP) film. The film may have a thickness from 12 μm to 250 μm, but preferably it is 25 μm thick.

The method may comprise the steps of (1) coating a first layer of the liquid photopolymer onto a surface; (2) exposing said layer to the light emitted by the visual display screen to form the first layer of cured or partially cured polymer; (3)

coating a second layer of the liquid photopolymer onto the first layer of cured or partially cured polymer; (4) exposing said second layer to the light emitted by the visual display screen to form a second layer of cured or partially cured polymer; (5) repeating steps (3) and (4) at least once to build up the three-dimensional object.

Step 3, forming the second layer of photopolymer will typically comprise moving the first layer away from the screen and allowing liquid photopolymer to occupy the space between the first layer and the screen. It may be that the separation of the first layer and the visual display screen is increased monotonically, i.e. the separation of the first layer and the visual display screen is increased between successive exposures by a distance corresponding with a layer thickness of a 3D object to be printed. It may be that the separation of the first layer and the visual display screen is increased between successive exposures by a distance greater than a layer thickness of a 3D object to be formed, and subsequently the separation of the first layer and the visual display screen is reduced by a second distance to provide a net increase in separation corresponding with a layer thickness of a 3D object to be formed. This facilitates the formation of the second layer of the liquid photopolymer in a way that reduces the likelihood of air bubbles which in turn would lead to defects in the resultant 3D object.

Each layer of cured polymer is a 2D image. This layer represents a cross-section of the completed object. It may be that all layers of cured polymer form different images. It may be that all of the layers are of the same thickness. It may be that the thickness of each layer is 0.1 mm or less. It may be that the thickness of each layer is 0.05 mm or less. It will be understood that layer thickness is subject to manufacturing tolerance, which may cause a microscopic difference in thickness of two layers that would be considered to be of the same thickness.

FIG. 1 shows this configuration where 100 is a build platform upon which a 3D object 102 is being built from a liquid polymer 101, contained in a tray 105, illuminated with light from an LCD screen 103 which is separated from the polymer by a low surface energy (or release) layer 104. Here the build platform moves up away from the screen. The object under construction must be separated from the release layer covering the screen as a natural attraction will occur.

If new layers are formed at the top surface of the growing object, then after each irradiation step the object under construction is lowered into the tray, a new layer of resin is coated on top and a new irradiation step takes place. In this process the tray of liquid polymer must be at least as deep as the tallest object being created. After the final layer has been created the entire object will be below the level of the liquid. FIG. 2 shows this configuration where the build platform 200 supports the 3D object 202 which is built from the liquid polymer 201, contained in the tray 205, illuminated with light from the LCD screen 203 which is separated from the polymer by the release layer 204.

The wavelength of the light is a length suitable to create polymerisation in the liquid polymer, this wavelength is solely daylight ie above 400 nm and below 700 nm. The illumination source is an LCD screen. The daylight selectively exposes an area of a thin layer of the liquid, solidifying it to form the relevant layer of the shape that is being created. At the end of this process the solidified layer is recoated with more resin and the process is repeated to harden another layer of resin on top of the previous layer. The process is repeated until the three-dimensional object is complete.

The shape of the cured polymer is determined by the shape of the image created on the LCD screen.

It is surprising that the novel photopolymers described in this application can be successfully used to make 3D objects, given both the low intensity of the light emitted from the screen and the absence of UV in its radiation. The intensity of light emitted from the backlight of an LCD screen is of an order of magnitude lower than that in any alternative 3D system, where the light is emitted typically by a digital light projector (DLP), array of UV LEDs or a laser. The light emitted is also exclusively in the daylight part of the spectrum, whereas all other 3D systems that cure polymer have a proportion of UV light present. It will be shown that these novel resins will polymerise in daylight generated from an unmodified LCD screen in exposure times that are comparable to those used in conventional 3D printers wherein the light includes a proportion of UV light of higher intensity.

Experimentation has shown that organometallic and specifically metallocene photoinitiators are most suitable for the invention, most desirably titanocene based photoinitiators give optimum rates of polymerisation. Examples of suitable titanocenes are bis($\eta^5$-2,4-cyclopentadien-1-yl)bis[2,6-difluoro-3-(1H-pyrrol-1-yl)phenyl]titanium, titanocene bis(trifluoromethanesulfonate), titanocene dichloride, (indenyl)titanium (IV) trichloride, (pentamethylcyclopentadienyl) titanium (IV) trichloride, cyclopentadienyltitanium (IV) trichloride, bis(cyclopentadienyl)titanium (IV) pentasulfide, (4R,5R)-chloro-cyclopentadienyl-[2,2-dimethyl-1,3-dioxolan-4,5-bis(diphenylmethoxy)]titanium, (4S,5S)-chloro-cyclopentadienyl-[2,2-dimethyl-1,3-dioxolan-4,5-bis(diphenylmethoxy)]titanium, and the like. The photoinitator used is most preferably bis($\eta^5$-2,4-cyclopentadien-1-yl)-bis(2,6-difluoro-3-(1H-pyrrol-1-yl)-phenyl) titanium which is manufactured by BASF under the tradename Irgacure 784 (Irg.784). This photoinitiator reacts mainly to the photons emitted from the blue pixels in an LCD screen.

In the present invention the base of the photopolymer formulation may be any light reactive system, including, but not limited to, those based on urethane acrylate and epoxy acrylate oligomers. Thus the base of the photopolymer will typically comprise one or more monomeric or oligomeric chemical species each comprising at least one carbon-carbon double bond which is polymerisable by free radical polymerisation. The term oligomer includes compounds having a few monomer units, e.g. dimers, trimers and tetramers etc. of monomers. The oligomeric species will not typically be formed from their constituent monomers using free radical polymerisation reactions. A urethane oligomer can be created by reacting any suitable polyol with an isocyanate, preferably toluene diisocyanate. This may occur in a stainless steel or glass vessel. The relative proportions of the two reactants are determined by their OH values with the reaction taking place in the presence of a catalyst such as n-butyl tin dilaurate.

Urethane acrylates are compounds having a radically-polymerizable ethylenic double bond, e.g. one which undergoes addition polymerization by the action of a photopolymerization initiation system when the photosensitive composition is selectively irradiated with daylight. Typical urethane acrylates are poly(meth)acrylate resins, for example polyether urethane polymers, or polyether polyester urethane copolymers such as polyether polyester urethane methacrylate photopolymers, polyester resins, unsaturated polyurethane resins, unsaturated polyamide resins.

Epoxy (meth)acrylates may, for example, be an epoxy (meth)acrylate of a polyepoxy compound such as (poly)

ethylene glycol polyglycidyl ether, (poly)propylene glycol polyglycidyl ether, (poly)tetramethylene glycol polyglycidyl ether, (poly)pentamethylene glycol polyglycidyl ether, (poly)neopentyl glycol polyglycidyl ether, (poly)hexamethylene glycol polyglycidyl ether, (poly)trimethylolpropane polyglycidyl ether, (poly)glycerol polyglycidyl ether or (poly)sorbitol polyglycidyl ether, with a hydroxy (meth) acrylate compound such as hydroxymethyl (meth)acrylate or hydroxyethyl (meth)acrylate.

Upon irradiation the polymer will undergo crosslinking and become tough and resilient, however in the areas where it is not irradiated it will remain liquid. The urethane acrylate is selected here to provide the desired rate of polymerisation, toughness and crosslinking properties, while in its unexposed state it is soluble in a solvent, suitably water so unexposed polymer is easily removed afterwards. The invention is not limited in use to this choice of oligomer and anyone skilled in the art could construct alternative polymers using alternative oligomers by applying these principles so described.

The composition can, for example, contain certain reactive diluents to bring additional properties to the resin and also reduce its viscosity. In certain embodiments, the composition further comprises one or more performance-enhancing additives including, for example, esters of acrylic or methacrylic acid, stabilisers, dyes and high molecular (i.e. those comprising greater than 8 carbon atoms) weight fatty acids.

Examples of fatty acids which are particularly effective in ensuring a dry, tack-free surface after post-curing of the washed plate include, for example, myristic acid.

It has been found that the rate of polymerisation can be greatly enhanced by the addition of at least one coinitiator. A coinitiator as referred to in the present invention is a compound that can generate free radicals when itself activated by the activated photoinitiator but which does not itself absorb light in the visible spectrum. The coinitiators can for example be selected from onium compounds, for example those where the onium cation is selected from iodonium, sulfonium, phosphonium, oxylsulfoxonium, oxysulfonium, sulfoxonium, ammonium, diazonium, selenonium, arsenonium and N-substituted N-heterocyclic onium cations wherein N is substituted with an optionally substituted alkyl, alkenyl, alkinyl or aryl (e.g. N-alkoxypyridinium salts); N-arylglycines and derivatives thereof (e.g. N-phenylglycine); aromatic sulfonyl halides; trihalomethylsulfones; imides such as N-benzoyloxyphthalimide; diazosulfonates; 9,10-dihydroanthracene derivatives; N-aryl, S-aryl or O-aryl polycarboxylic acids with at least two carboxy groups of which at least one is bonded to the nitrogen, oxygen or sulfur atom of the aryl unit (e.g. aniline diacetic acid and derivatives thereof, hexaarylbiimidazoles; thiol compounds (otherwise known as mercaptans) (e.g. mercaptobenzthiazoles, mercaptooxadiazoles, mercaptotetrazines, mercaptoimidazoles, mercaptotetrazoles, mercaptopyridines, mercaptooxazoles and mercaptotriazoles; they include 2-mercaptobenzoxazole, 2-mercaptobenzothiazole, 2-mercaptobenzimidazole, pentaerythritol-tetrakis(mercaptoacetate), 4-acetamidothiophenol, mercaptosuccinic acid, dodecanthiol, betamercaptoethanol, 6-ethoxy-2-mercaptobenzothiazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4-methoxybenzene thiol, 1-phenyl-1H-tetrazole-5-thiol, 4-phenyl-4H-1,2,4-triazole-3-thiol, pentaerythritol-tetrakis (3-mercaptopropionate), trimethylolpropane-tris(mercaptoacetate), 2-mercaptopyridine, 4-mercaptopyridine, 2-mercapto-3H-quinazoline and 2-mercaptothiazoline); 1,3,5-triazine derivatives with 1 to 3 $CX_3$ groups (wherein every X is independently selected from a chlorine or bromine atom, and is preferably a chlorine atom), such as e.g. 2-phenyl-4,6-bis(trichloromethyl)-s-triazine, 2,4,6-tris (trichloromethyl)-s-triazine, 2-methyl-4,6-bis(trichloromethyl)-s-triazine, 2-(styryl-4,6-bis(trichloromethyl)-s-triazine, 2-(p-methoxystyryl)-4,6-bis(trichloromethyl)-s-triazine, 2-(4-methoxy-naphtho-1-yl)-4,6-bistrichloromethyl-s-triazine, 2-(4-ethoxy-naphtho-1-yl)-4, 6-bis(trichloromethyl)-s-triazine and 2-[4-(2-ethoxyethyl)-naphtho-1-yl]-4,6-bis(trichloromethyl)-s-triazine; oxime ethers and oxime esters, such as for example those derived from benzoin; α-hydroxy or α-amino acetophenones; mono-, di- and triacylphosphine oxides, and peroxides.

It has been found that thiol or mercaptan coinitiators are particularly suitable to enhance the rate of growth of polymer when irradiated with low intensity daylight and also provide the finished object with a dry surface finish. Thus, a suitable coinitiator may be a described by the formula $X—(SH)_n$ where X represents any organic moiety, and n represents a number from 1 to 10. It is possible to incorporate mercaptan groups into resins such as mercapto modified polyester acrylate resin and these compositions have a similar effect to unmodified thiols in respect of this invention.

It has been found that in systems wherein titanocene based polymer systems are activated solely by daylight, there is no growth until a lower threshold of illumination is reached, then the rate of growth is roughly linear up to an upper threshold of illumination, after that it has been found that the rate of growth with increase in time declines to almost zero. Illumination here means a continuous exposure of the same intensity of daylight for an increasing time measured in seconds. This shows that there is an upper level for the exposure time after which no significant growth can be achieved. It is proposed that the absence of growth after a threshold is reached may be caused by the relatively low energy of the daylight radiation providing ample opportunity for the photons to strike cured matter and impart their energy instead of travelling further through to reach liquid polymer on the other side of the cured matter. This makes the system in effect, self-stabilising.

Photopolymer formulations used in 3D typically contain stabilisers to prevent overexposure. Z-axis overexposure is where there is unwanted solidification of polymer under an overhang due to the penetration of light through already polymerised layers (called print-through). This z axis overcure is a known source of inaccuracy and slicing algorithms have adjustments written to compensate for it. Overcure in x:y axis is also possible in areas surrounded by polymerised areas. Polymerisation is a cumulative process so when the energy in the sensitised area reaches a threshold level polymerisation starts and this can create unwanted solidification. This is particularly problematic in liquid areas surrounded by solid polymer as chains build most easily by extending already polymerised chains.

Stabilisers may be incorporated into these formulations to prevent any overcure. Stabilisers can be either UV absorbers which convert UV light into heat, such as 2-hydroxyphenyl-benzophenones, 2-(2-hydroxyphenyl)-benzotriazoles, or 2-hydroxyphenyl-s-triazines, or they are antioxidants that also deactivate the free radicals such as sterically hindered phenols, phosphites and thioethers. There are a number of stabilisers present in 3D printing compositions; for example but not limited to, Irgastab UV10 and Tinuvin 292 from BASF 1,2,2,6,6-pentamethyl-4-piperidyl methacrylate, 2-hydroxy-4-n-octoxybenzophenone, 2(2'-hydroxy-5'-methylphenyl)benzotriazole and N,N-dimethyl benzylamine. There are also residual amounts of stabilisers such as hydroquinone present in the oligomers and reactive diluents.

The photopolymer formulation may comprise at least one stabiliser that prevents degradation of the cured polymer in the 3D object. Exemplary stabilisers include hindered amine light stabilisers (HALS) which deactivate the free radicals such as tetramethyl piperidine derivatives. Further exemplary stabilisers include sterically hindered monophenols, e.g. 2,6-di-tert-butyl-p-cresol or Butylated Hydroxy Toluene (BHT). Further exemplary stabilisers include alkylated thiobisphenols, e.g. 2,2-methylenebis-(4-methyl-6-tert-butylphenol) and 2,2-bis (1-hydroxy-4-methyl-6-tert-bytylphenyl) sulfide. The photopolymer formulation may comprise two stabilisers, the stabilisers being 2,6-di-tertiarybutyl-4-methyl phenol and a disubstituted diphenyl amine.

The photopolymer formulation may comprise substantially no stabilisers other than those which prevent degradation of the cured polymer in the 3D object and/or those which prevent overcure. It has been found that these daylight activated formulations do not require any additional stabilisers as the intensity of light present in non-intended areas is below the threshold necessary to initiate polymerisation. This is a surprising discovery with many ramifications in the creation of accurate high resolution objects.

'Substantially no stabilisers' of any given type is intended to mean that no more such stabilisers are present than would be present in the formulation by virtue of having been present in the constituent chemicals of the photopolymer formulation when they were mixed together. All commercially available chemicals, and particularly polymerisable monomers and oligomers, contain small amounts of stabiliser. 'Substantially no stabiliser' of any given type may mean that no such stabilisers have been added to the formulation.

It has been found that there is no activity at all until a threshold concentration of titanocene is achieved. Surprisingly it has also been shown that there can be two peaks of photosensitivity of titanocene and that after the second peak of titanocene is reached, adding additional titanocene has a marginally negative effect of photosensitivity.

It has been found that in the case of daylight activated photopolymer exposed by LCD screens, the level of titanocene determines the shape of exposure curve when plotting the amount of growth against exposure time. It is surprising that different levels of titanocene do not follow the same shape of curve as previously described. Lower concentrations of titanocene can produce greater rate growth than higher concentrations at the shorter exposure times, whereas this situation can be reversed at longer exposure times. This shows that the optimised concentration of titanocene in the polymer is a function of the desired cured layer thickness. The most effective formulation to deliver the fastest growth is specific to the desired thickness. This means that there is a different optimised concentration of titanocene to create a 0.1 mm layer, than to create a 0.05 mm layer, for instance.

In general lower concentrations, such as 1.5% of titanocene or below, will produce greater depth of cure in longer exposures, but higher concentrations of titanocene, such as 2% or above, will produce thinner depths of cure, faster.

It has been found that the optimal resolution of the screen is obtained from screens with a high ratio of its contrast ratio to total its luminance. The contrast ratio of an LCD system is defined as the ratio of the luminance of its brightest colour (white) to that of its darkest colour (black). It has been found that ideally this number should be above 1.0 and it is desirable for it to be as high as possible.

It was found that there was not a linear relationship between rate of growth and luminance. High luminance screens were found to polymerise up to 3 times faster than lower output screens in proportion to their luminance. It is proposed that this may be because there is an optimum intensity at which polymerisation occurs at the fastest rate. The resolution of the image has been found to be a function of both brightness and contrast. Surprisingly the narrowness of viewing angle has been found to have little or no effect on resolution. This may be because in this apparatus the screen is only 25 μm away from the build layer and the effect of widening the light has little effect so close. It was found that the best resolution was obtained from screens which combined high pixel density (PPI) with the highest ratio of contrast ratio to brightness. It has been found that a contrast ratio of above 1 combined with a high PPI (160 or above) gives a very high resolution in the x:y plane of the order of 200 μm or higher for the finished object.

It has been found that the addition of other daylight active photoinitiators can have at best no positive effect when used in conjunction with titanocene and at worst a negative effect on photosensitivity. It is suggested that this may be because these photoinitiators use some of the available photons that would have been available to transfer their energy onto the titanocene in order for it to initiate molecular cleavage, and therefore, as titanocene is more able to utilise the photons effectively, the overall photosensitivity of the compound is reduced by the addition of alternative photoinitiators.

It has been found that the addition of thiols, mercaptons or mercapto modified polyester acrylate resins increase the rate of growth and enhance the surface dryness of daylight polymer when exposed to daylight emitted from an LCD screen. It has been found that the rate of growth is maximised at about 3% thiol addition.

Polymers containing titanocene exhibit by their nature a dark amber colour. Because of their sensitivity to daylight and the low intensity of the light being used to polymerise them, it is surprising that they can be coloured at all, as the colour would conventionally absorb available light for polymerisation. It is more surprising that by selecting the correct pigments, the polymers can be coloured giving strong and vibrant colours that look comparable to pigmented systems based on clear UV polymers. It has been found that there is also a slow transition in colour from the initial post polymerisation colour to its final state after UV degradation and/or oxidation, this generally is seen as a reduction of the brown titanocene pigment and an increase of the masking pigment. By judicious selection of the pigment and its % addition it is possible to end up with UV stable colours that are solid, pleasing to the eye and of predictable colour and density. Furthermore it has been found that with the addition of these pigments or dyes the reduction is cure speed is surprisingly small, in fact in thin layers it is hardly noticeable at all and proportionately less than would be expected when pigmenting UV systems.

EXAMPLES

Various aspects of the invention will now be particularly described with reference to the following examples, which were all performed using the following standard procedure described below.

The Standard Daylight 3D Exposure Procedure 3D objects were created from software such as Meshmixer (www.meshmixer.com), engineering CAD packages or were obtained from open sharing websites such as Pinshape (www.pinshape.com) or Thingiverse (www.thingiverse.com). The models to be created in 3D were stored in suitable file formats such as .stl or .obj. The model was sliced into layers to be sent to the 3D printer by a program called Creation Workshop from Envision Labs, which is an open source digital light projector (DLP) compatible piece of software. The slicing engine processes the model and cuts it into a large number of 2D image layers at the specified thickness that can be printed, this thickness also defines the height of z-axis movement required.

The exposure time for each layer is defined as the time the screen shows each image before it moves to the next image. It is desirable to initially expose for a longer time for the first exposure to build a solid foundation on the build platform to build onto. The build platform was a sheet of anodised aluminium that had a roughened surface.

The 3D printer used was a Liquid Crystal 3D printer manufactured by Photocentric Ltd, various screens were fitted into this machine as the imaging sources.

To begin a print, the print platform was levelled and pressed against the bottom of the tray, lightly making contact with the protective layer, which was in contact with the LCD screen. Enough resin to expose the object was poured into the tray. The tray could be topped up during the printing process if necessary, but was initially filled with 100 g. The resin trays were constructed from an open tray of 3 mm thick acrylic with a base of 25 μm FEP film, manufactured by Dupont under the tradename Teflon FEP.

The play button on the Creation Workshop software was depressed and the print process was commenced. When the print finished the object was removed from the tray and was rinsed with warm water. The object was left in water in direct sunlight for 20 minutes to dry the surface and post-expose fully.

A formulation (Formulation A) was created that was highly photo-reactive, hard when cured and provided a dry surface, being ideally suited to make 3D objects for prototyping and other applications. Formulation A is shown in Table 1. This formulation was used in all the following examples, except where modifications to the formulations are described in those examples.

Example 1—The Increase of Depth of Cure with Increased Exposure Time

In this experiment the LCD screen used in the Liquid Crystal 3D printer was a 7" rear view reversing display screen, known as screen D. This screen had a manufacturer's quoted brightness of 250 candela, however it was measured at 197 candela using a Konica Minolta LS110 luminance meter, by turning the screen on to show a completely white display and holding the meter on the screen in a darkened room. The screen had 800×480 pixels generating 133 pixels per inch (PPI). The image was sent from the computer to the screen via a video graphics array (VGA) input.

The standard daylight procedure described earlier was used. The print platform was removed after the required set of exposure cycles and the thickness of layer created was measured. The exposure time was adjusted and the results are shown in Table 2 and graphically in FIG. 3.

TABLE 2 the amount of polymer growth with increased time using the Formulation A.

| Time (sec) | Thickness (mm) |
| --- | --- |
| 10 | 0.04 |
| 11 | 0.04 |
| 12 | 0.04 |
| 13 | 0.05 |
| 14 | 0.06 |
| 15 | 0.07 |
| 16 | 0.07 |
| 17 | 0.08 |
| 18 | 0.1 |
| 19 | 0.1 |
| 20 | 0.11 |
| 21 | 0.1 |
| 22 | 0.11 |
| 23 | 0.11 |
| 24 | 0.12 |
| 25 | 0.13 |
| 26 | 0.12 |
| 27 | 0.13 |
| 30 | 0.13 |

TABLE 1

| Formulation A | | | | |
| --- | --- | --- | --- | --- |
| Function | Grade | Supplier | Type | % |
| Oligomer | Ebecryl 8210 | Allnex | Aliphatic urethane acrylate | 48.0 |
| Reactive diluent | Genomer 1122 | Rahn | Monofunctional aliphatic urethane acrylate | 22.0 |
| Reactive diluent | SR205 | Sartomer | Tri ethylene dimethacrylate | 17.0 |
| Reactive diluent | SR350 | Sartomer | Trimethylpropane Trimethacrylate | 7.9 |
| Thiol (coinitiator) | Thiocure PETMP | Bruno Bock | Pentaerythritol Tetrakis(3-mercaptopropionate) | 3.0 |
| Photoinitiator | Irgacure 784 | BASF | Bis(.eta.5-2,4-cylcopentadien-1-yl)-bis(2,6-difluoro-3-(1H-pyrrol-1-yl)-phenyl) titanium | 2.1 |
| | | | Total | 100 |

TABLE 2-continued the amount of polymer growth with increased
time using the Formulation A.

| Time (sec) | Thickness (mm) |
| --- | --- |
| 33 | 0.15 |
| 36 | 0.17 |
| 39 | 0.19 |
| 42 | 0.19 |
| 50 | 0.2 |
| 60 | 0.2 |

It has been found that there is an exposure threshold being the time up to which no growth takes place, then the rate of growth is roughly linear up to a point, after which it can be seen that the rate of growth with increase in time declines to almost zero, in this example about 45 seconds.

Example 2—Optimising the Addition of Irg.784

Figure 4:
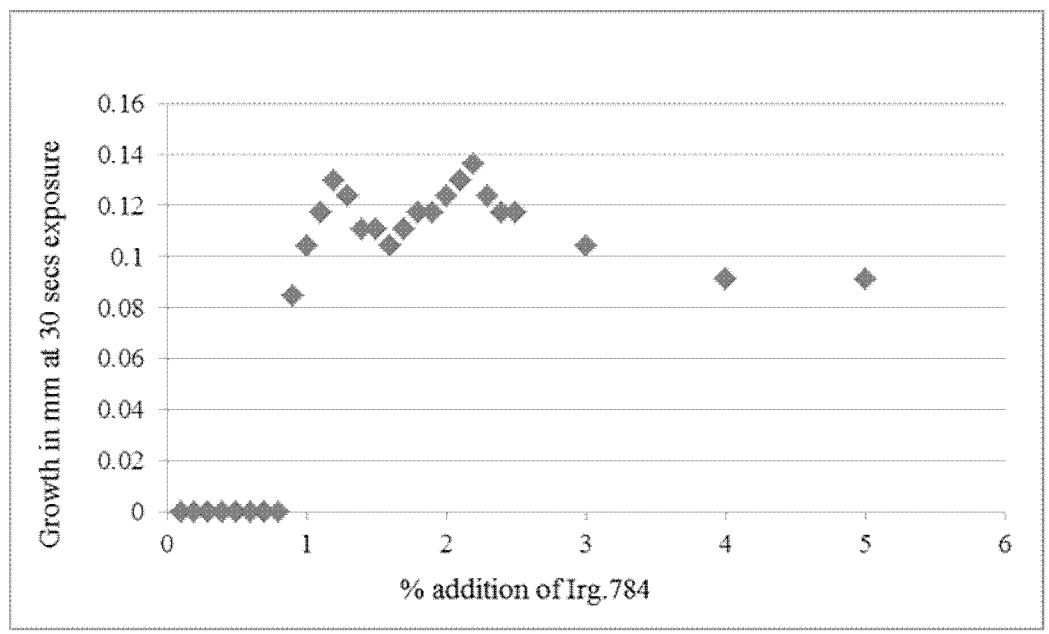
FIG. 4 shows graphically the data in Table 3, the growth at 30 seconds exposure with different % additions of Irg.784.

To investigate how the rate of cure is influenced by the level of Irg.784, the standard formulation without any Irg.784 was taken. To it was added 0.1% addition of Irg.784 and then this was separately increased by 0.1% increments. The mixtures were stirred in a glass vessel for 60 minutes at 60° C. and left to stand for 24 hours to allow all the air to either break the surface or be absorbed. This process was used for all future raw material additions. The formulations were tested for growth at various exposure times in the Liquid Crystal 3D printer with screen D inserted as the imaging source using the standard procedure described earlier. The results are laid out in Table 3 and shown graphically in FIG. 4.

TABLE 3 the amount of growth at 30 seconds exposure
with different % additions of Irg.784.

| % additional of Irg 784 | Growth with 30 secs exposure |
| --- | --- |
| 0.1 | 0.00 |
| 0.2 | 0.00 |
| 0.3 | 0.00 |
| 0.4 | 0.00 |
| 0.5 | 0.00 |
| 0.6 | 0.00 |
| 0.7 | 0.00 |
| 0.8 | 0.08 |
| 0.9 | 0.10 |
| 1 | 0.12 |
| 1.1 | 0.13 |
| 1.2 | 0.12 |
| 1.3 | 0.11 |
| 1.4 | 0.11 |
| 1.5 | 0.10 |
| 1.6 | 0.11 |
| 1.7 | 0.12 |
| 1.8 | 0.12 |
| 1.9 | 0.12 |
| 2 | 0.13 |
| 2.1 | 0.14 |
| 2.2 | 0.12 |
| 2.3 | 0.12 |
| 2.4 | 0.12 |
| 2.5 | 0.10 |
| 3 | 0.09 |
| 4 | 0.09 |
| 5 | 0.08 |

It can be seen that there are very surprisingly two peaks of activity at approximately 1.1% and 2.1% concentrations of Irg.784. It can be seen that there is no activity at all until a threshold concentration is reached, in this case 0.8%. After the second peak of 2.1% has been reached, additional quantities of Irg.784 surprisingly have a negative effect of photosensitivity.

Example 3—The Effect of Increased Time with Different % Additions of Irg.784

Figure 5:
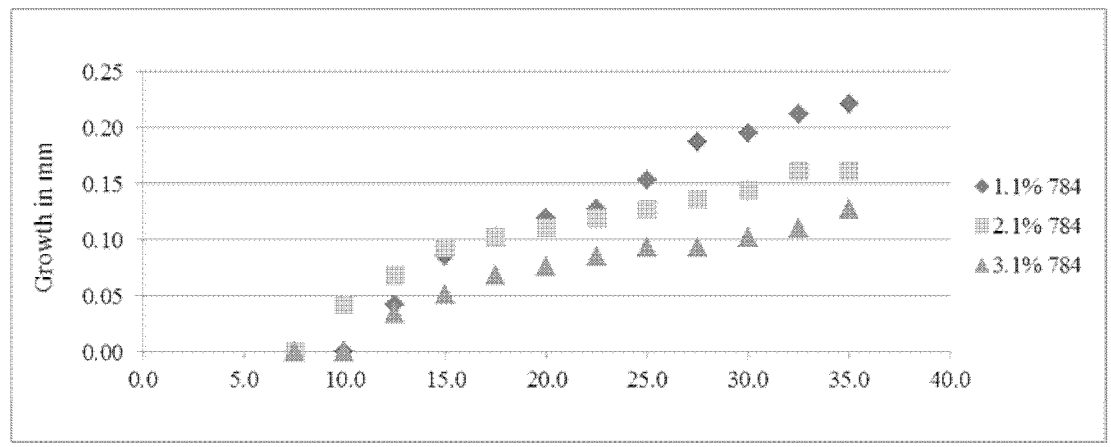
FIG. 5 shows graphically the data in Table 4, the growth at different exposure times with different % additions of Irg.784.

The standard formulation was used, but with the concentration of Irg.784 set at three levels 1.1%, 2.1% and 3.1%. They were tested for rate of growth at various exposure times in the Liquid Crystal 3D printer with screen D inserted as the imaging source using the standard procedure described earlier. The rate of growth at different exposure times was determined at these concentrations. The results are laid out in Table 4 and shown graphically in FIG. 5.

TABLE 4

Growth in mm of polymer at different exposure
times with different % of Irg.784

| Time (secs) | 1.1% 784 | 2.1% 784 | 3.1% 784 |
| --- | --- | --- | --- |
| 7.5 | 0.00 | 0.00 | 0.00 |
| 10.0 | 0.00 | 0.04 | 0.03 |
| 12.5 | 0.04 | 0.07 | 0.05 |
| 15.0 | 0.09 | 0.09 | 0.07 |
| 17.5 | 0.10 | 0.10 | 0.08 |
| 20.0 | 0.12 | 0.11 | 0.09 |
| 22.5 | 0.13 | 0.12 | 0.09 |
| 25.0 | 0.15 | 0.13 | 0.09 |
| 27.5 | 0.19 | 0.14 | 0.10 |
| 30.0 | 0.20 | 0.14 | 0.11 |
| 32.5 | 0.21 | 0.16 | 0.13 |
| 35.0 | 0.22 | 0.16 | 0.14 |

It was found that at the lowest 1.1% Irg.784 level the required time to initiate growth is longer than for the higher concentrations, as would be expected. What is surprising is that at 20 seconds exposure the amount of growth is greatest at the lowest concentration of Irg.784, namely 1.1%. This shows that the optimised % addition of Irg.784 is a function of the desired final object layer thickness.

Example 4—The Effect of Other Photoinitiators in Conjunction with Irg.784

Figure 6:
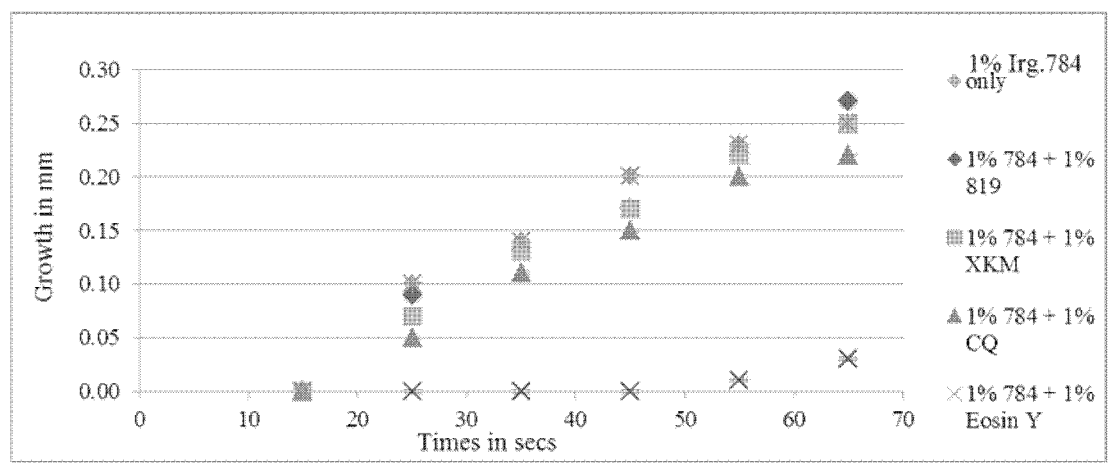
FIG. 6 shows graphically the data in Table 5 being the effect of combining other photoinitiators with 1% of Irg.784.

The standard formulation was taken, but with the addition of Irg.784 reduced to 1%. To this formulation was added a number of other photoinitiators that would be expected to have some synergistic effect in conjunction with titanocene and pick up some of the unused energy available in the daylight region. The following photoinitiators were added at 1%; Irgacure 0.819 from BASF (Bis(2,4,6-trimethylbenzoyl)-phenylphosphineoxide) which has activity up to 430 nm and has been used successfully in daylight systems in conjunction with Irg.784 in the past, Speedcure XKm from Lambson a substituted acyl-phosphine oxide with activity up to 410 nm but highly active with LED light, Camphor quinone (CQ) from Sigma Aldrich (part number 24893) which has an absorption range of 400-550 nm and Eosin Y (yellow) 2',4',5',7'-Tetrabromofluorescein from Sigma Aldrich (part number E4009) which is a tetrabromo derivative of fluorescein and has absorption up to 470 nm. These were then tested for growth at various exposure times in the Liquid Crystal 3D printer with screen D inserted as the imaging source using the standard procedure described earlier. The results are laid out in Table 5 and shown graphically in FIG. 6.

TABLE 5 the effect of other photoinitiators in conjunction with 1% Irg.784 in the standard formulation.

| Exposure time in secs | 1% 784 + 1% 819 | 1% 784 + 1% XKM | 1% 784 + 1% CQ | 1% 784 + 1% Eosin Y | 1% 784 only |
|---|---|---|---|---|---|
| 15 | 0.00 | 0.00 | 0.00 | 0.00 | 0.00 |
| 25 | 0.09 | 0.07 | 0.05 | 0.00 | 0.10 |
| 35 | 0.13 | 0.13 | 0.11 | 0.00 | 0.14 |
| 45 | 0.17 | 0.17 | 0.15 | 0.00 | 0.20 |
| 55 | 0.22 | 0.22 | 0.20 | 0.01 | 0.23 |
| 65 | 0.27 | 0.25 | 0.22 | 0.03 | 0.25 |

It can be seen that none of these combinations match the photosensitivity effect of titanocene on its own. This shows that these other photoinitiators have at best no positive effect when used in conjunction with titanocene, and at worst a negative effect on photosensitivity.

Example 5—The Effect of LCD Display Screens with Different Properties

The standard formulation was used with three different concentrations of Irg.784; namely 1%, 2% and 3%. These were tested to determine the polymer growth that they created at various exposure times in the Liquid Crystal 3D printer with five different LCD screens inserted as the imaging source, again using the standard procedure described earlier. The screen properties are tabulated in Table 6.

TABLE 6

Summary of properties of different screens evaluated

| Type | Size (") | Resolution W | Resolution H | Pixels/Inch (PPI) | Theoretical voxel size in μm | Brightness (cd/m²) Quoted | Brightness (cd/m²) Tested | Contrast Ratio | Active Matrix Type | Backlight |
|---|---|---|---|---|---|---|---|---|---|---|
| D | 7 | 800 | 480 | 133 | 191 | 250 | 197 | 350 | TFT | LED |
| E | 10 | 1024 | 768 | 128 | 198 | 250 | 176 | 400 | TFT | LED |
| K | 8 | 1024 | 768 | 160 | 159 | 600 | 568 | 450 | TFT | LED |
| L | 10.1 | 1024 | 768 | 127 | 200 | 1000 | 853 | 500 | TFT | LED |
| M | 5 | 800 | 480 | 187 | 136 | 500 | 426 | 500 | TFT | LED |

Figure 7:
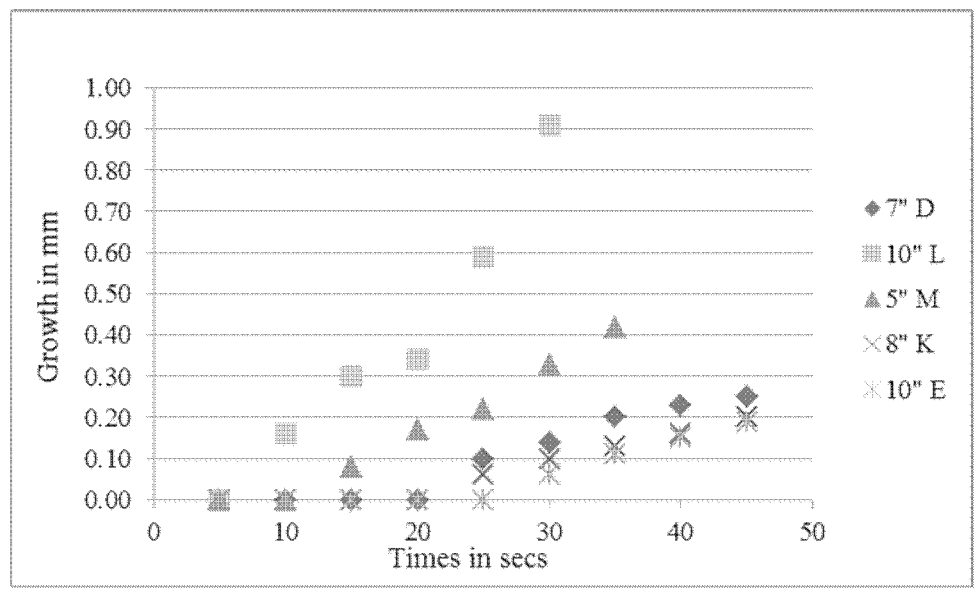
FIG. 7 shows graphically the data in Table 7 being the growth at different exposure times using different LCD screens with 1% Irg.784.
Figure 8:
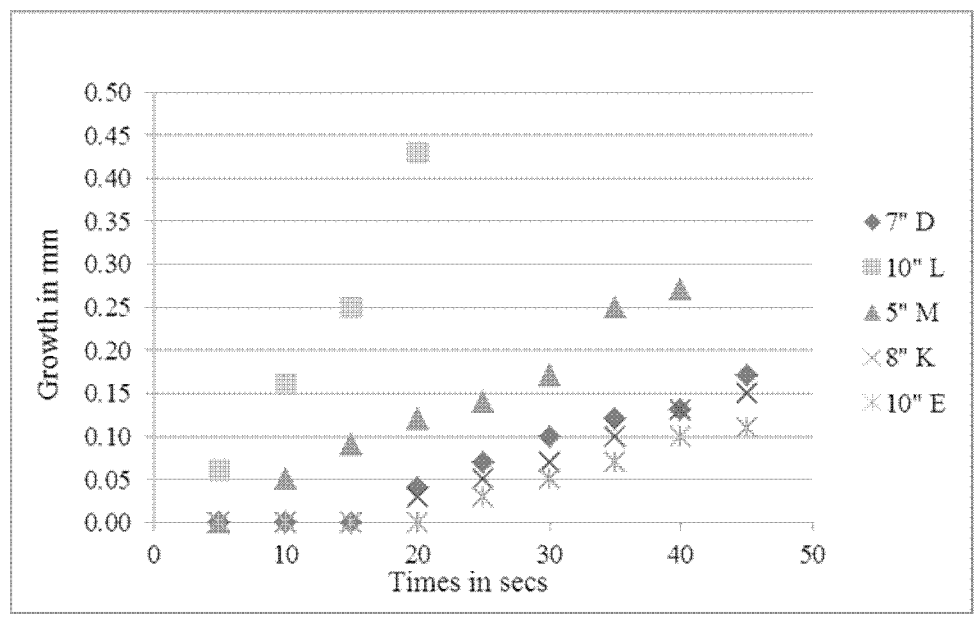
FIG. 8 shows graphically the data in Table 8 being the growth at different exposure times using different LCD screens with 2% Irg.784.
Figure 9:
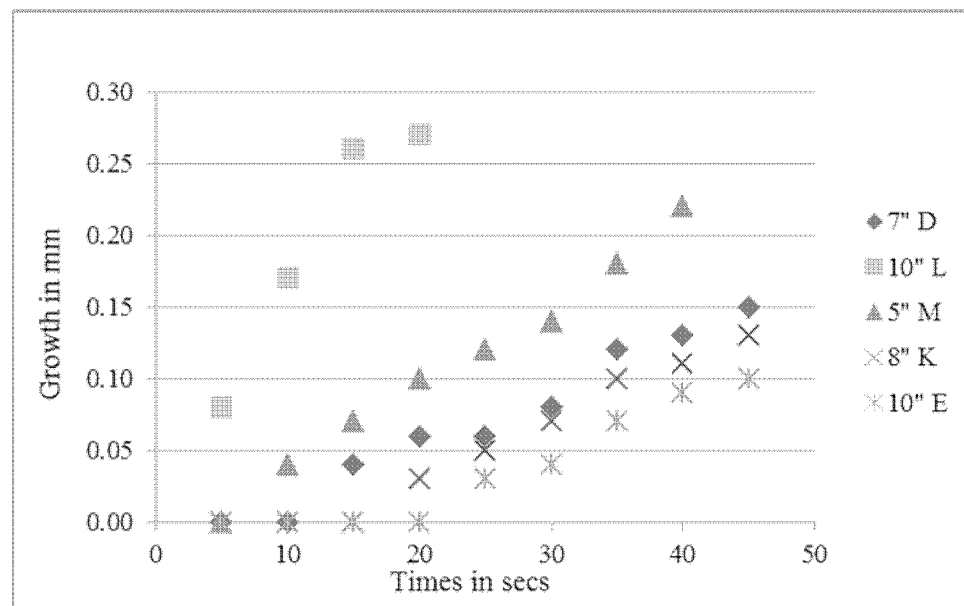
FIG. 9 shows graphically the data in Table 9 being the growth at different exposure times using different LCD screens with 3% Irg.784.

The results of exposure time and amount of growth for 1% Irg.784 are shown in Table 7 and FIG. 7, for 2% Irg.784 are shown in Table 8 and FIG. 8 and for 3% Irg.784 are shown in Table 9 and FIG. 9.

TABLE 7

The amount of growth at different times with different screens at 1% Irg784

| Time (s) | 7" D | 10" L | 5" M | 8" K | 10" E |
|---|---|---|---|---|---|
| 5 | 0.00 | 0.00 | 0.00 | 0.00 | 0.00 |
| 10 | 0.00 | 0.16 | 0.00 | 0.00 | 0.00 |
| 15 | 0.00 | 0.30 | 0.08 | 0.00 | 0.00 |
| 20 | 0.00 | 0.34 | 0.17 | 0.00 | 0.00 |
| 25 | 0.10 | 0.59 | 0.22 | 0.06 | 0.00 |
| 30 | 0.14 | 0.91 | 0.33 | 0.10 | 0.06 |
| 35 | 0.20 |  | 0.42 | 0.13 | 0.11 |
| 40 | 0.23 |  |  | 0.16 | 0.15 |
| 45 | 0.25 |  |  | 0.20 | 0.19 |

TABLE 8

The amount of growth at different times with different screens at 2% Irg784

| Time (s) | 7" D | 10" L | 5" M | 8" K | 10" E |
|---|---|---|---|---|---|
| 5 | 0.00 | 0.06 | 0.00 | 0.00 | 0.00 |
| 10 | 0.00 | 0.16 | 0.05 | 0.00 | 0.00 |
| 15 | 0.00 | 0.25 | 0.09 | 0.00 | 0.00 |
| 20 | 0.04 | 0.43 | 0.12 | 0.03 | 0.00 |
| 25 | 0.07 |  | 0.14 | 0.05 | 0.03 |
| 30 | 0.10 |  | 0.17 | 0.07 | 0.05 |
| 35 | 0.12 |  | 0.25 | 0.10 | 0.07 |
| 40 | 0.13 |  | 0.27 | 0.13 | 0.10 |
| 45 | 0.17 |  |  | 0.15 | 0.11 |
| 50 | 0.19 |  |  | 0.16 | 0.12 |

TABLE 9

The amount of growth at different times with different screens at 3% Irg784

| Time (s) | 7" D | 10" L | 5" M | 8" K | 10" E |
|---|---|---|---|---|---|
| 5 | 0.00 | 0.08 | 0.00 | 0.00 | 0.00 |
| 10 | 0.00 | 0.17 | 0.04 | 0.00 | 0.00 |
| 15 | 0.04 | 0.26 | 0.07 | 0.00 | 0.00 |
| 20 | 0.06 | 0.27 | 0.10 | 0.03 | 0.00 |
| 25 | 0.06 |  | 0.12 | 0.05 | 0.03 |
| 30 | 0.08 |  | 0.14 | 0.07 | 0.04 |
| 35 | 0.12 |  | 0.18 | 0.10 | 0.07 |
| 40 | 0.13 |  | 0.22 | 0.11 | 0.09 |
| 45 | 0.15 |  |  | 0.13 | 0.10 |
| 50 | 0.18 |  |  | 0.13 |  |

It can be seen that the relationship between light intensity emitted and rate of polymer growth is not linear.

The contrast ratio of an LCD screen is the ratio of the luminance of its brightest colour (white) to that of its darkest colour (black). High luminance screens such as L, which was measured at 853 cd/sqm (nits), have been shown to polymerise 15 times the depth of cure than low light output screens such as E, which was measured at 197 cd/sqm, can. This shows that the lower intensity screen, being $\frac{1}{5}^{th}$ of the luminance, generates only $\frac{1}{15}^{th}$ of the photosensitivity of the high intensity one.

The resolution of the image has been found to be a function of both brightness and contrast. Surprisingly viewing angle has been found to have little to no effect on object resolution. From experimentation it was found that the best resolution was obtained from screens which combined high pixel density (PPI) with the highest ratio of contrast ratio to brightness. The ratio of contrast ratio to brightness for D was 1.8, for E was 2.3, for K was 0.8, for L was 0.6 and for M was 1.2. It has been found that a contrast ratio of above 1.0 combined with a high PPI of 160 or above gives a very high resolution of the order of 200 m in the x:y plane or higher in the final object. Furthermore it has been found that the rate of cure is a function of the concentration of Irg.784 and the screen type, so for instance when using screen D at 25 seconds exposure, a 1% Irg.784 formulation produces no growth at all whereas the 2% Irg.78 will produce 0.07 mm, however expose for longer and the situation reverses; at 45 seconds the 1% Irg784 formulation produces 0.25 mm whereas the 2% only generates 0.17 mm. Similarly using screen L at 5 secs exposure a 2% Irg784 formulation will produce 0.06 mm growth with the 3% producing 0.08 mm, however at 20 secs the 2% Irg784 formulation produces 0.43 mm whereas the 3% only generates 0.27 mm.

Example 6—The Effect of Thiol Containing Coinitiators in Conjunction with Irg784

Figure 10:
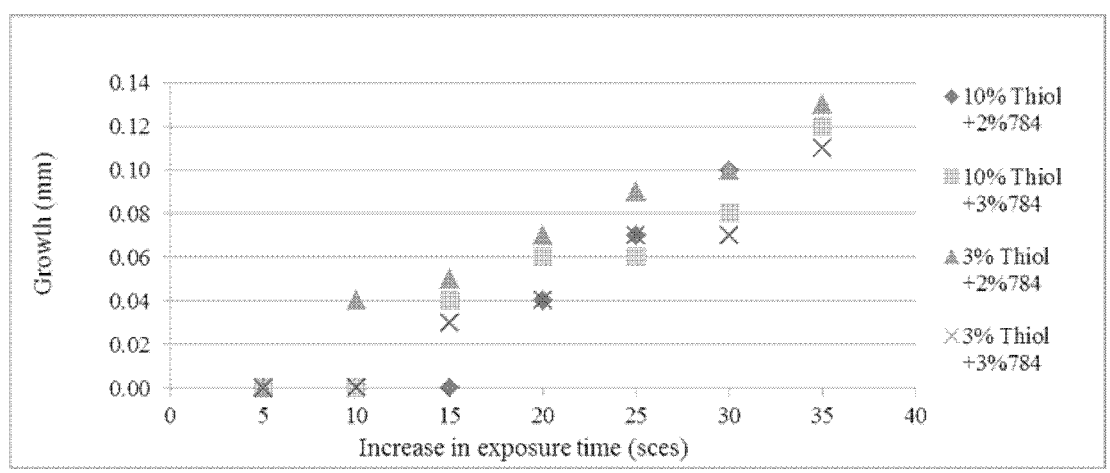
FIG. 10 shows graphically the data in Table 10 being the growth at different exposure times using 3% and 10% thiol in combination with 2% and 3% Irg.784.

The thiol used was PETMP pentaerythritol tetrakis(3-mercaptopropionate) from Bruno Bock. It was added at two concentrations; 3% and 10%, and these were tested in turn with two concentrations of Irg.784; 2% and 3%, in each case replacing the concentrations in the standard formulation. These formulations were then tested for growth at various exposure times in the Liquid Crystal 3D printer with screen D inserted as the imaging source, using the standard procedure as described before. The results of exposure time and amount of growth are shown in Table 10 and FIG. 10.

TABLE 10

The comparison of different concentrations of thiol and Irg.784

| Time (s) | 10% Thiol + 2% 784 | 10% Thiol + 3% 784 | 3% Thiol + 2% 784 | 3% Thiol + 3% 784 |
| --- | --- | --- | --- | --- |
| 5 | 0.00 | 0.00 | 0.00 | 0.00 |
| 10 | 0.00 | 0.00 | 0.04 | 0.00 |
| 15 | 0.00 | 0.04 | 0.05 | 0.03 |
| 20 | 0.04 | 0.06 | 0.07 | 0.04 |
| 25 | 0.07 | 0.06 | 0.09 | 0.07 |
| 30 | 0.10 | 0.08 | 0.10 | 0.07 |
| 35 | 0.12 | 0.12 | 0.13 | 0.11 |

It can be seen that there is a reduction in rate of growth after a certain threshold level of thiol is reached.

Example 7—The Effect of Increasing Thiol Concentrations with 2% Irg.784

In further expanding upon Example 6 to determine the exact point of thiol addition that maximises the photosensitivity effect, a range of thiol concentrations were added from 2% to 10%, and they were tested with 2% of Irg.784, replacing both the concentrations in the standard formulation. These formulations were tested for growth at various exposure times in the Liquid Crystal 3D printer with screen D inserted as the imaging source using the standard procedure as described before. The results of exposure time and amount of growth are shown in Table 11 and FIG. 11.

TABLE 11

The growth in mm at 2% Irg.784 and different thiol concentrations

| Time (secs) | 2% Thiol | 2.5% Thiol | 3% Thiol | 4% Thiol | 5% Thiol | 10% Thiol |
| --- | --- | --- | --- | --- | --- | --- |
| 5 | 0.00 | 0.00 | 0.02 | 0.00 | 0.00 | 0.00 |
| 10 | 0.00 | 0.04 | 0.06 | 0.04 | 0.00 | 0.00 |
| 15 | 0.03 | 0.06 | 0.07 | 0.05 | 0.04 | 0.04 |
| 20 | 0.05 | 0.08 | 0.09 | 0.08 | 0.08 | 0.07 |
| 25 | 0.08 | 0.09 | 0.11 | 0.10 | 0.10 | 0.10 |
| 30 | 0.10 | 0.11 | 0.12 | 0.10 | 0.10 | 0.10 |
| 35 | 0.11 | 0.12 | 0.13 | 0.12 | 0.12 | 0.12 |
| 40 | 0.13 | 0.12 | 0.15 | 0.13 | 0.13 | 0.13 |
| 45 | 0.14 | 0.14 | 0.16 | 0.14 | 0.13 | 0.13 |
| 50 | 0.15 | 0.14 | 0.17 | 0.15 | 0.15 | 0.15 |
| 55 | 0.16 | 0.15 | 0.18 | 0.17 | 0.17 | 0.17 |
| 60 | 0.17 | 0.17 | 0.20 | 0.19 | 0.19 | 0.19 |
| 65 | 0.18 | 0.17 | 0.20 | 0.19 | 0.19 | 0.19 |

It can be seen that the rate of growth is maximised at about 3% thiol addition.

Example 8—The Effect of Adding Colourants to Daylight Photopolymer

A variety of different pigments were tested to ensure long term compatibility with the resin and long term UV stability. Optimal results were found when using the following colourants; white colour was obtained from grade O112 made by Kromachem, pink colour was obtained from grade Red 3 130417-002 made by Sterling Colour, violet colour was obtained from grade TP039 HD20 made by Kromachem, orange colour was obtained from grade Orange 5 131126-042 made by Sterling Colour, yellow colour was obtained from grade 9Y40 from Penn Color, red colour was obtained from grade 9R504 made by Penn Color and black colour was obtained from grade 516 made by Kromachem. These were added separately to the standard formulation. These formulations were then tested for polymer growth at various exposure times in the Liquid Crystal 3D printer with screen D inserted as the imaging source, using the standard procedure as described before. The results of exposure time and amount of growth are shown in Table 12.

TABLE 12

The effect of colouring daylight resin

| Time (sec) | No colour | 0.5% white | 1% white | 0.5% pink | 0.5% orange | 0.5% yellow |
| --- | --- | --- | --- | --- | --- | --- |
| 20 | 0.05 | 0.05 | 0.03 | 0.02 | 0.00 | 0.00 |
| 25 | 0.07 | 0.06 | 0.05 | 0.05 | 0.04 | 0.05 |
| 30 | 0.09 | 0.07 | 0.06 | 0.08 | 0.05 | 0.08 |
| 35 | 0.11 | 0.09 | 0.07 | 0.09 | 0.07 | 0.10 |
| 40 | 0.13 | 0.11 | 0.09 | 0.11 | 0.10 | 0.12 |
| 45 | 0.15 | 0.13 | 0.11 | 0.13 | 0.12 | 0.15 |
| 50 | 0.17 | 0.15 | 0.11 | 0.14 | 0.14 | 0.17 |
| | | | | | 0.1% violet | 0.25% violet |

TABLE 12-continued

The effect of colouring daylight resin

| Time (sec) | 0.3% red | 0.5% red | 0.25% violet | 0.1% violet | 0.5% white | 0.5% white |
|---|---|---|---|---|---|---|
| 20 | 0.00 | 0.00 | 0.00 | 0.00 | 0.00 | 0.00 |
| 25 | 0.04 | 0.04 | 0.03 | 0.04 | 0.03 | 0.03 |
| 30 | 0.00 | 0.05 | 0.04 | 0.05 | 0.00 | 0.04 |
| 35 | 0.07 | 0.05 | 0.05 | 0.07 | 0.04 | 0.04 |
| 40 | 0.09 | 0.08 | 0.06 | 0.08 | 0.06 | 0.05 |
| 45 | 0.11 | 0.09 | 0.08 | 0.10 | 0.06 | 0.05 |
| 50 | 0.13 | 0.10 | 0.08 | 0.11 | 0.07 | 0.06 |

Figure 11:
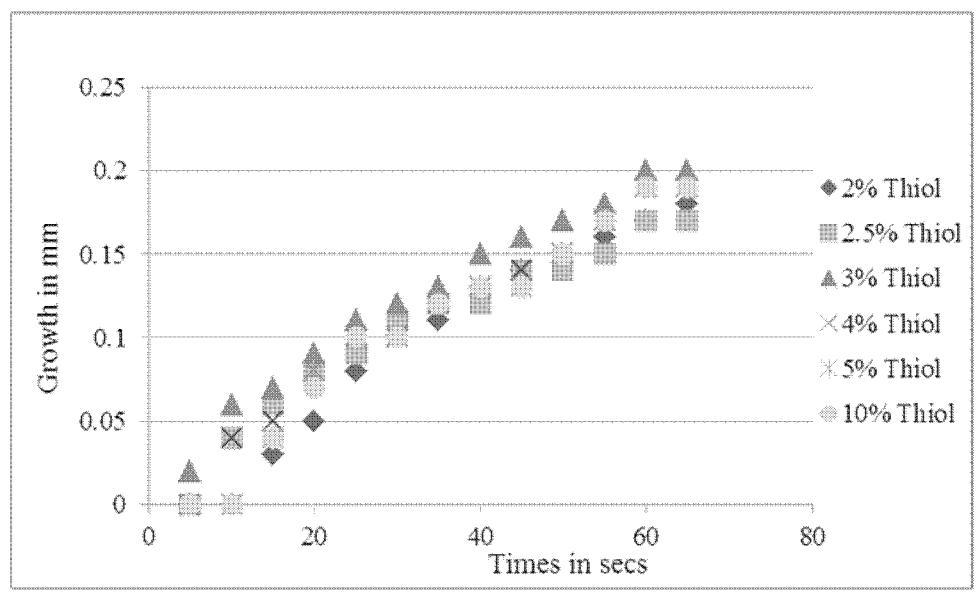
FIG. 11 shows graphically the data in Table 11 being the growth at different exposure times using a variety of different thiol concentrations at 2% Irg.784.

Strong vibrant colours were obtained masking the dark amber colour that is evident in all titanocene containing compounds. The reduction is cure speed was surprisingly small with the addition of these colourants, in fact proportionately less than would be expected from similar additions in UV systems, and is shown in FIG. 11.

Example 9—Formulations Exhibiting Low Shrinkage

It is an object of this example to demonstrate formulations that exhibit markedly lower shrinkage when polymerised by exposure to daylight emitted from a visual display screen in a 3D printer. Shrinkage occurs when the double bonds open upon polymerisation to reconfigure into more tightly packed configurations. The urethane oligomer present in other examples has here been replaced by different epoxies which exhibit lower shrinkage.

Reactivity was evaluated by measuring polymer growth at various exposure times in the Liquid Crystal 3D printer with screen D inserted as the imaging source using the standard procedure described earlier. Viscosity was tested by measuring the sample at 25 C on a Brookfield viscomiter using spindle 2. Hardness was tested by depressing a PCE-DD D hardness tester into a 10 mm thick cured sample. Shrinkage was measured by using a densimeter SD-200L from Qualitest.

The properties of the urethane oligomer Ebecryl 8210, made by Allnex, was compared directly in the same addition percentage to Miramer 241, a Bisphenol A (EO)4 Dimethacrylate, made by Miwon. The optimised percentage of Miramer 241 was established at about 66% creating the most desirable overall combination of viscosity, hardness, reactivity and shrinkage. The following epoxies were found to have attractive properties and are shown at the same addition percentage; Miramer 2300, a Bisphenol A (EO)30 Diacrylate, Ebecryl 3203 a modified Bisphenol A epoxy acrylate, Ebecryl 6040 a modified Bisphenol A epoxy acrylate, Photomer 3016-40R, made by IGM Resins, a Bisphenol A epoxy diacrylate diluted with 40% TMPTA and Photomer 3620, a mono epoxy acrylate.

TABLE 13 formulations tested for shrinkage

| No. | Oligomer | Monomers | Co-initiator | Initiator |
|---|---|---|---|---|
| 1 | 48% Ebecryl 8210 | 22% Genomer 1122, 17% SR205, 8% SR350 | 3% PETMP | 2% Irg 784 |
| 2 | 48% Miramer 241 | 22% Genomer 1122, 17% SR205, 8% SR350 | 3% PETMP | 2% Irg 784 |
| 3 | 66% Miramer 241 | 15% Genomer 1122, 9% SR205, 5% SR350 | 3% PETMP | 2% Irg 784 |
| 4 | 66% Miramer 2300 | 15% Genomer 1122, 9% SR205, 5% SR350 | 3% PETMP | 2% Irg 784 |
| 5 | 66% Ebecryl 3203 | 15% Genomer 1122, 9% SR205, 5% SR350 | 3% PETMP | 2% Irg 784 |
| 6 | 66% Ebecryl 6040 | 15% Genomer 1122, 9% SR205, 5% SR350 | 3% PETMP | 2% Irg 784 |
| 7 | 66% Photomer 3016-40R | 15% Genomer 1122, 9% SR205, 5% SR350 | 3% PETMP | 2% Irg 784 |
| 8 | 66% Photomer 3620 | 15% Genomer 1122, 9% SR205, 5% SR350 | 3% PETMP | 2% Irg 784 |

TABLE 14

Shrinkage and other properties of the formulations of Table 13

| No. | Viscosity (@ 25° C.) | Reactivity (mm/20 secs) | Hardness (Shore D) | Shrinkage (% volume) |
|---|---|---|---|---|
| 1 | 580 | 0.11 | 75 | 7.9 |
| 2 | 270 | 0.10 | 83 | 6.2 |
| 3 | 380 | 0.09 | 85 | 5.8 |
| 4 | 350 | 0.08 | 76 | 5.7 |
| 5 | 310 | 0.12 | 82 | 5.6 |
| 6 | 750 | 0.09 | 85 | 5.9 |
| 7 | 390 | 0.12 | 85 | 6.3 |
| 8 | 420 | 0.12 | 85 | 5.8 |

Thus, it has been found that by replacing the urethane oligomer with an epoxy, it is possible to achieve considerably less volumetric shrinkage on curing.

The invention claimed is:

1. A method for creating a 3-dimensional object, the method comprising forming more than two layers of a cured polymer by exposing a liquid photopolymer formulation to light emitted by a liquid crystal display (LCD) screen, wherein the liquid photopolymer formulation comprises:
   at least one monomeric and at least one oligomeric chemical species each comprising at least one carbon-carbon double bond that is polymerizable by free radical polymerization, said monomeric and oligomeric chemical species present in a total amount of from 25 to 99 wt %;
   at least one titanocene photoinitiator present in a total amount of from 0.1 to 2.5 wt %;
   at least one thiol co-initiator present in a total amount of from 0.5 to 5 wt %; and
   optionally at least one pigment or dye,
   wherein the at least one oligomeric chemical species comprises:
   40 to 75 wt % aliphatic urethane acrylate oligomer comprising three acrylate groups; and
   wherein the at least one monomeric chemical species comprises: 20 to 45 wt % other monomeric species comprising at least one carbon-carbon double bond that is polymerisable by free radical polymerization.

2. The method of claim 1, wherein the LCD screen has a luminescence of between 100 and 2000 candela per square meter.

3. The method of claim 1, wherein the liquid photopolymer is contained in a tray having a transparent base, the tray being situated above the LCD screen.

4. The method of claim 1, wherein the formulation comprises an epoxy acrylate oligomer.

5. The method of claim 1, wherein the titanocene is selected from the group consisting of bis(η5-2,4-cyclopentadien-1-yl)bis[2,6-difluoro-3-(1H-pyrrol-1yl)phenyl]titanium, titanocene bis(trifluoromethanesulfonate), titanocene dichloride, (indenyl)titanium (IV) trichloride, (pentamethylcyclopentadienyl)titanium (IV) trichloride, cyclopentadienyltitanium (IV) trichloride, bis(cyclopentadienyl)titanium (IV) pentasulfide, (4R,5R)-chloro-cyclopentadienyl-[2,2-dimethyl-1,3-dioxolan-4,5-bis(diphenylmethoxy)]titanium, and (4S,5S)-chloro-cyclopentadienyl-[2,2-dimethyl-1,3-dioxolan-4,5-bis(diphenylmethoxy)]titanium, and mixtures thereof.

6. The method of claim 5, wherein the titanocene is bis(η5-2,4-cyclopentadien-1-yl)-bis(2,6-difluoro-3-(1H-pyrrol-1-yl)-phenyl) titanium.

7. The method of claim 1, wherein the or each co-initiator is a compound represented by the formula X-(SH)$_n$ where X represents any organic moiety, and n represents a number from 1 to 10.

8. The method of claim 1, wherein the co-initiator is selected from the group consisting of 2-mercaptobenzoxazole, 2-mercaptobenzothiazole, 2-mercaptobenzimidazole, pentaerythritol-tetrakis(mercaptoacetate), 4-acetamidothiophenol, mercapto succinic acid, dodecanthiol, betamercaptoethanol, 6-ethoxy-2-mercaptobenzothiazole, 4-methyl-4H-1,2,4-triazole-3-thiol, 2-mercapto-1-methylimidazole, 2-mercapto-5-methylthio-1,3,4-thiadiazole, 5-n-butylthio-2-mercapto-1,3,4-thiadiazole, 4-methoxybenzene thiol, 1-phenyl-1H-tetrazole-5-thiol, 4-phenyl-4H-1,2,4-triazole-3-thiol, pentaerythritol-tetrakis(3-mercaptopropionate), trimethylolpropane-tris(mercaptoacetate), 2-mercaptopyridine, 4-mercaptopyridine, 2-mercapto-3H-quinazoline and 2-mercaptothiazoline, and mixtures thereof.

9. The method of claim 1, wherein the co-initiator is an oligomeric moiety comprising thiol groups.

10. The method of claim 9, wherein the co-initiator is a mercapto-modified polyester acrylate.

11. The method of claim 1, comprising at least one pigment or dye.

12. The method of claim 1, comprising at least one stabilizer that prevents degradation of the cured polymer in the 3D object and/or at least one stabilizer that prevents overcure.

* * * * *